(12) United States Patent
Raorane et al.

(10) Patent No.: US 11,145,583 B2
(45) Date of Patent: Oct. 12, 2021

(54) METHOD TO ACHIEVE VARIABLE DIELECTRIC THICKNESS IN PACKAGES FOR BETTER ELECTRICAL PERFORMANCE

(71) Applicant: Intel Corporation, Santa Clara, CA (US)

(72) Inventors: Digvijay Raorane, Chandler, AZ (US); Yidnekachew Mekonnen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 648 days.

(21) Appl. No.: 15/970,602

(22) Filed: May 3, 2018

(65) Prior Publication Data

US 2019/0341342 A1 Nov. 7, 2019

(51) Int. Cl.
*H05K 1/02* (2006.01)
*H05K 3/36* (2006.01)
*H01L 23/498* (2006.01)
*H01L 21/48* (2006.01)

(52) U.S. Cl.
CPC ...... *H01L 23/49822* (2013.01); *H01L 21/486* (2013.01); *H01L 21/4857* (2013.01); *H01L 23/49816* (2013.01); *H05K 1/0277* (2013.01); *H05K 3/361* (2013.01)

(58) Field of Classification Search
CPC .......... H05K 1/0277–0283; H05K 3/361–365
See application file for complete search history.

(56) References Cited

U.S. PATENT DOCUMENTS 6,252,176 B1 * 6/2001 Kuramochi ............ H05K 1/024
174/254

* cited by examiner

*Primary Examiner* — Jeremy C Norris
(74) *Attorney, Agent, or Firm* — Schwabe, Williamson & Wyatt, P.C.

(57) ABSTRACT

Embodiments include packages substrates and a method of forming the package substrate. A package substrate includes a first dielectric comprising a first conductive layer, and a second dielectric comprising a second conductive layer and a third conductive layer. The second and third conductive layers are embedded in the second dielectric, where a top surface of the third conductive layer is above a top surface of the second conductive layer. The package substrate has a fourth conductive layer on the second dielectric. The first dielectric has a first dielectric thickness between the first and third conductive layers. The first dielectric also has a second dielectric thickness between the first and second conductive layers. The package substrate includes the second dielectric thickness that is greater than the first dielectric thickness. The second dielectric may have a z-height of a first bottom surface greater than a z-height of a second bottom surface.

24 Claims, 9 Drawing Sheets

METHOD TO ACHIEVE VARIABLE DIELECTRIC THICKNESS IN PACKAGES FOR BETTER ELECTRICAL PERFORMANCE

FIELD

Embodiments relate to packaging semiconductor devices. More particularly, the embodiments relate to dielectrics having variable thicknesses within adjacent dielectric layers in a semiconductor device and methods for forming such devices.

BACKGROUND

Components of packaging of semiconductor devices, such as package substrates, present several problems. Package substrates are used in the packaging of integrated circuits (ICs) to provide mounting surfaces for the ICs and to facilitate electrical connection between the ICs. The package substrates include a plurality of electrically-conductive interconnects for transporting electric current. The interconnects are electrically insulated from one another by a dielectric, also known as build-up layers, in which the interconnects are formed. Existing package substrates, however, suffer from several problems.

One of the main problems with manufacturing (or packaging) a package substrate is having multiple ICs on the package substrate that need their own dielectric thickness for optimal performance. Optimal dielectric thickness is needed by multiple ICs (or intellectual property (IP) chips/blocks within silicon (Si)) and packaging applications. Conventional package substrates may utilize Ajinomoto Build-up Film (ABF) for forming build-up layers. Typically, the build-up layer thickness is selected based on the most demanding electrical requirement needed for one of the ICs, routing requirements, or applications of the IP from that build-up layer. Thus, the other ICs get lowered optimal dielectric thicknesses.

One such IC is a high-speed input/output (HSIO) interconnect that needs reduced crosstalk to have an optimal electrical performance. The drive to increase the overall speed requirements related to HSIO communications in electronic devices has necessitated improvement in the electrical performances of the HSIO interconnects. Accordingly, any improvements in HSIO communications/interconnects enable faster communication among electronic devices.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are systems that include semiconductor packages and methods of forming such semiconductor packages. According to some embodiments, the semiconductor package (or package substrate) described below and methods of forming such semiconductor package include dielectrics having variable thicknesses within adjacent dielectric layers (or stacked dielectric layers) at various regions in/across the semiconductor package. For some embodiments, the semiconductor packages described herein enable integrated circuits (ICs) and/or multiple packaging applications to have their own desired dielectric thicknesses based on the optimal electrical performance of that IC and/or packaging application in one or more adjacent dielectric layers.

Figure 1:
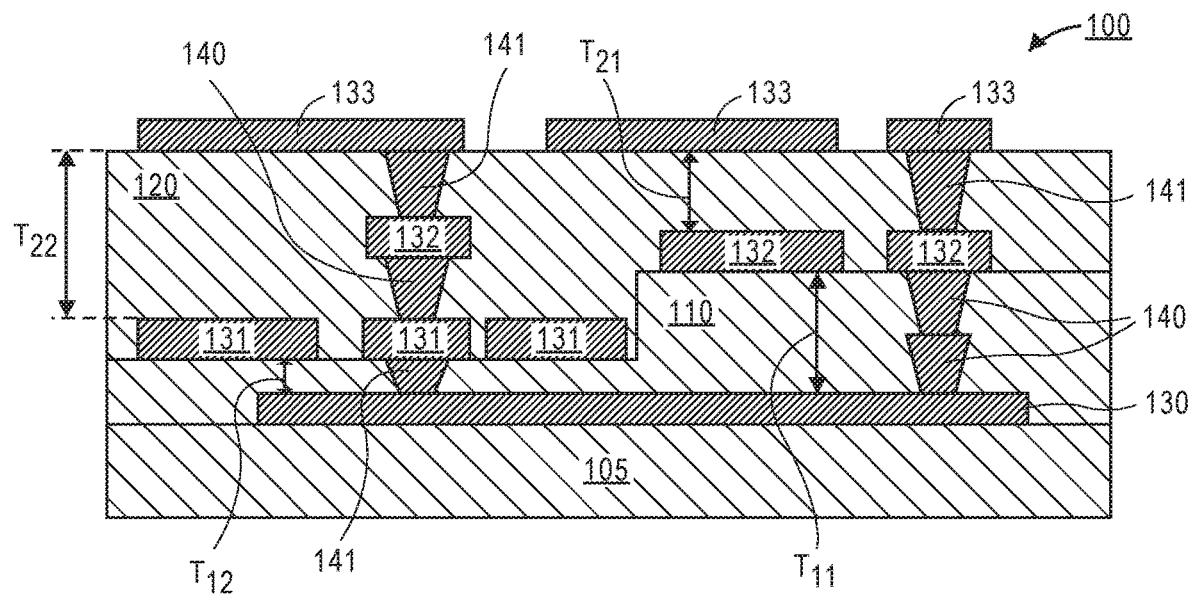
FIG. 1 is a cross-sectional view of a package substrate having a plurality of vias, one or more conductive layers, a dielectric, a first dielectric, and a second dielectric, including varying dielectric thicknesses with each of the first and second dielectrics, according to some embodiment.

According to some embodiments, a package substrate is described (e.g., the package substrate 100 shown in FIG. 1). For one embodiment, the package substrate has a first dielectric comprising a first conductive layer. In one embodiment, the package substrate also has a second dielectric comprising a second conductive layer and a third conductive layer, where the second and third conductive layers are embedded in the second dielectric, and where a top surface of the third conductive layer is above a top surface of the second conductive layer. For one embodiment, the package substrate has a fourth conductive layer on the second dielectric. According to one embodiment, the first dielectric may have a first dielectric thickness (e.g., thickness $T_{11}$) between the first conductive layer and the third conductive layer. According to this embodiment, the first dielectric may also have a second dielectric thickness (e.g., thickness $T_{12}$) between the first conductive layer and the second conductive layer, where the first dielectric thickness (e.g., thickness $T_{11}$) may be greater than the second dielectric thickness (e.g., thickness $T_{12}$) within the first dielectric. Additionally, in one embodiment, the second dielectric may have a second dielectric thickness (e.g., thickness $T_{21}$) between the third conductive layer and the fourth conductive layer. In another embodiment, the second dielectric may have a second dielectric thickness (e.g., thickness $T_{22}$) between the second conductive layer and the fourth conductive layer, where the first dielectric thickness (e.g., thickness $T_{21}$) may be less than the second dielectric thickness (e.g., thickness $T_{22}$) within the second dielectric. Accordingly, for these embodiments, the package substrate includes first and second dielectrics that have different dielectric thicknesses within the same respective dielectric (as described above) and within adjacent dielectrics (e.g., the second thickness $T_{22}$ of the second dielectric may be greater than the first thickness $T_{11}$ of the first dielectric).

As described above, in current packaging technologies the package substrate has multiple ICs that need varying/different dielectric thicknesses for optimal electrical performance (i.e., an IC may need its own dielectric thickness to reach its optimal electrical performance), but the dielectric thickness is instead chosen based on the most demanding electrical requirement of only one IC in the die for that layer. Accordingly, the dielectric thickness of the other ICs in the package substrate get a reduced optimal dielectric thickness and are thus formed with roughly the same dielectric thickness across the package substrate.

In contrast, embodiments of the semiconductor package help to achieve variable dielectric thicknesses in adjacent dielectric layers to improve the electrical performances of the ICs of the semiconductor package. One such IC can have a high-speed input/output (HSIO) interconnect that needs reduced cross-talk for better electrical performance. To reduce crosstalk in single-ended HSIO signals such as on-package input/output (OPIO) and double data rate (DDR) at higher data rates, embodiments of the semiconductor package enable modulating (or varying) dielectric thicknesses in a signal routing area to reduce cross talk between signals, and modulating dielectric thicknesses in signal routing applications to provide a transmission line design flexibility to design the impedance of a signal to a desired target. Accordingly, embodiments of the semiconductor package may optimize the electrical performances of such ICs (e.g., ICs that have HSIO interconnects for faster communication) by disposing a second dielectric layer with a thickness (e.g., thickness $T_{22}$) on a first dielectric layer having a thickness (e.g., thickness $T_{11}$), where the second thickness (e.g., thickness $T_{22}$) may be larger than (or less than) the first thickness (e.g., thickness $T_{11}$) to optimize a HSIO signal routing disposed in the adjacent first and second dielectric layers (e.g., as shown in FIG. 1).

For other embodiments, the semiconductor package also facilitates multiple other applications with optimal dielectric thicknesses, such applications include microstrip and stripline routing layers, and package passive components, such as inductors. For one embodiment, the semiconductor package described herein helps to enable dielectric thickness variations in a microstrip layer and a stripline layer. For example, the embodiments of the dielectric thickness variations (i) reduce crosstalk in single-ended HSIO signals at higher data rates, (ii) creates a transmission line design flexibility to design the impedance of a signal to a desired target, and (iii) provides design flexibility to design differential signals to a target differential impedance. Moreover, the embodiments of the dielectric thickness variations also provide the design flexibility benefits of package passives designs. For example, one package passive design may include designing and optimizing air core inductors (ACIs) with inductor turns having (or designed with) variable dielectric thicknesses.

According to some embodiments, the dielectric thickness variations in a package substrate may be formed using a lithographic patterning operation defined by a height of a via in the build-up layer (as shown in FIGS. 2A-2G), and/or a plasma etching of a build-up layer (e.g., an ajinomoto build-up film (ABF)) followed by lithographic patterning operation (as shown in FIGS. 3A-3J).

These embodiments described herein improve the existing packaging technologies by enabling packaging solutions such as: (i) a package substrate may have a varying dielectric thickness within the same dielectric layer and/or within adjacent dielectric layers, (ii) a single thickness of an ABF may be used to get a variation in dielectric thicknesses across the package substrate, (iii) multiple dielectric thicknesses may be disposed within adjacent metal layers at various regions in the package substrate, (iv) the variable dielectric thicknesses may be compatible with standard flip-chip substrate manufacturing processes, (v) the package substrate may facilitate (or support) multiple applications such as controlling crosstalk in HSIO interconnects and/or designing of ACIs, (vi) the package substrate may improve the reliability and certainty of the package substrate, (vii) the variable dielectric thicknesses of the package substrate may be formed independent of layer counts or package sizes and may thus be used for wide variety of products, (viii) the method used to form the variable dielectric thicknesses of the package substrate may be repeated multiple times within the package substrate build-up layers independently, and (ix) the package substrate may be implemented with standard materials used in semiconductor packaging, and (x) the package substrate may allow a single ABF thickness that is different than the incoming film thickness or than multiples of that ABF.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including a package substrate having a first dielectric having one or more varying thickness that may be different than one or more thicknesses of a second dielectric, as these varying dielectric thicknesses in the interconnect structures of the electronic devices (or semiconductor packages) may provide optimal electrical performances for the ICs of that device.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1 is a cross-sectional view of a package substrate 100 having a plurality of vias 140-141, one or more conductive layers 131-133, a dielectric 105, a first dielectric 110, and a second dielectric 120, according to one embodiment. Specifically, FIG. 1 illustrates the first dielectric 110 having a first thickness $T_{11}$ that is greater than a second thickness $T_{12}$ of the first dielectric 110, and the second dielectric 120 having a first thickness $T_{21}$ that is less than a second thickness $T_{22}$ of the second dielectric 120. Additionally, the package substrate 100 may have adjacent dielectrics 110 and 120 with varying dielectric thickness, such as the second thickness $T_{22}$ of the second dielectric 120 may be greater than the first thickness $T_{11}$ of the first dielectric 110.

Figure 4:
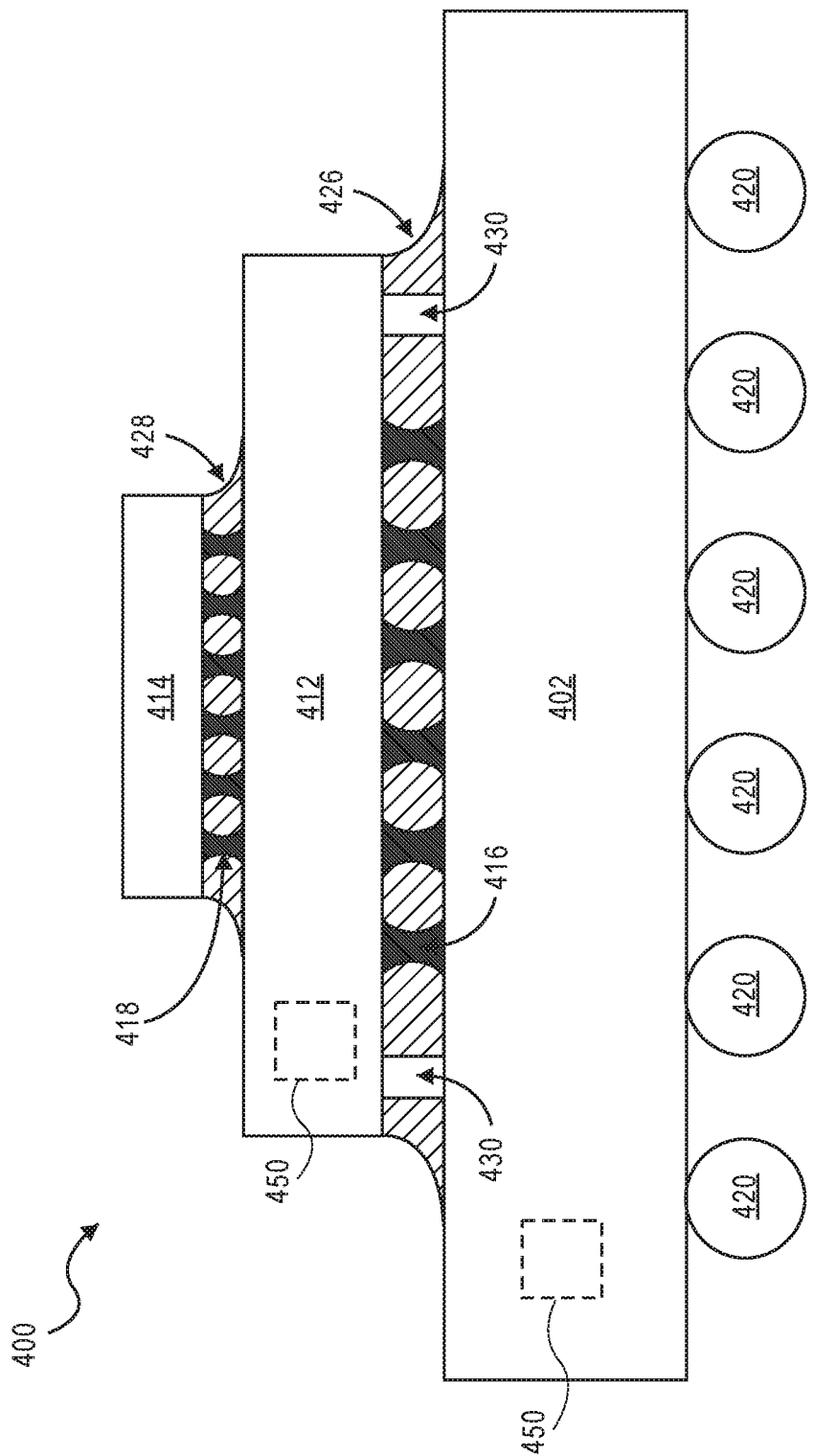
FIG. 4 is a cross-sectional view of a semiconductor packaged system having a substrate, a die, and a packaged substrate that includes a build-up layer with varying dielectric thicknesses with each of the first and second dielectrics, according to one embodiment.

For some embodiments, the package substrate 100 may be included in a semiconductor package (e.g., as shown in FIG. 4), where the semiconductor package may include a package substrate (e.g., package substrate 402 of FIG. 4) and one or more additional substrates, dies, interposers, etc., that are stacked (or coupled) to form the semiconductor package. According to some embodiments, the package substrate 102 may include, but is not limited to, a substrate, a printed circuit board (PCB), and a motherboard. For one embodiment, the package substrate 100 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers 105, 110, and 115, where each dielectric layer can be a photosensitive dielectric layer. For some embodiments, holes may be drilled in the PCB 100. For one embodiment, the PCB 100 may also include conductive layers 131-133 (e.g., copper lines/pads/traces), vias 140-141, via pads, and holes.

In one embodiment, the package substrate 100 may include a first conductive layer 130 on a dielectric 105, a second and third conductive layers 131-132 on a first dielectric 110, and a third conductive layer 132 on a second dielectric layer 120. By way of example, the dielectric layers 105, 110, and 120 may be a polymer material, such as, for example, polyimide, epoxy, or build-up film (BF). For one embodiment, the first and second dielectric layers 110 and 120 may be ABFs. In an embodiment, the dielectric layers 105, 110, and 120 may be one layer in a stack that includes a plurality of dielectric layers used to form a build-up structure. As such, by way of example, the dielectric layer 105 may be formed over another dielectric layer.

Additional embodiments may include disposing (or forming) the dielectric layer 105 as the base dielectric layer over a core material on which the stack is formed. In one embodiment, the conductive layers 130-133 may be formed on a copper seed layer. For one embodiment, the conductive layers 130-133 may include one or more electrical contacts, including, but not limited to, metallic (or copper) pads, signal lines, vias, via pads, planes, and/or the like. According to an additional embodiment, the dielectric 105 may be the bottommost layer of the package substrate 100 and may be, but is not limited to, a metallic material, an adhesive layer/film/tape, or any other core material (e.g., a glass panel). As such, in this additional embodiment, the dielectric 105 may be omitted if needed (or based on the desired packaging design).

The package substrate 100 may have the second dielectric layer 120 disposed on (and adjacent to) the first dielectric layer 110. In one embodiment, the second dielectric layer 120 has a first bottom surface (on the right side of the package substrate 100) and a second bottom surface (on the left side of the package substrate 100). In one embodiment, the first conductive layer 130 and the vias 140-141 may be disposed (or patterned/formed) in the first dielectric layer 110. For one embodiment, the second and third conductive layers 131-132 and the vias 140-141 may be disposed in the second dielectric layer 120. For one embodiment, the second conductive layer 131 is disposed on the second bottom surface of the second dielectric layer 120, and the third conductive layer 132 is disposed on the first bottom surface of the second dielectric layer 120. For one embodiment, the vias 140 may be zero misalignment vias (ZMVs) and plated using a zero misalignment litho process. For other embodiments, two stacked vias may be disposed on the first conductive layer 130 using litho, where a lower via has a wide top surface that can land a second via on top of the wide top surface of the lower via (i.e., the stacked vias are not limited to ZMVs). Meanwhile, the vias 141 may be formed with any convention process including, for example, a laser/drilling process to form via openings that are then plated to form the vias 141. Note that these processes are described in further detail below (e.g., in FIG. 2A-2G and FIGS. 3A-3J). Note For one embodiment, the topmost surface of the first dielectric layer 110 (as shown on the right side of package substrate 100) has a z-height that is greater than a z-height of the top surface of the second conductive layer 131 disposed in the opening (or cavity) of the first dielectric layer 110. For one embodiment, the topmost surface of the third conductive layer 132 has a z-height that is greater than a z-height of the top surface of the second conductive layer 131 disposed in the opening of the first dielectric layer 110. For one embodiment, the topmost surface of the ZMV pad 132 on the ZMV via 140 (on the left side of the package substrate 100) has a z-height that is approximately equal to or greater than a z-height of the top surface of the third conductive layer 132 that is disposed on the topmost surface of the first dielectric layer 110 (on the right side of the package substrate 100). Note that, as described above and illustrated in FIG. 1, the third conductive layer 132 has a portion of the third conductive layer 132 disposed on the first dielectric layer 110 (as shown on the right of the package substrate 100), as the via pad 132 of the third conductive layer 132 is on the ZMV via 140 in the second dielectric layer 120.

Furthermore, as illustrated, the ZMVs 140, the via 141, and the first conductive layer 130 may be formed in the first dielectric layer 110 to have a first thickness $T_{11}$ and a second thickness $T_{12}$. For one embodiment, the first thickness $T_{11}$ may be a thickness of the first dielectric layer 110 defined between the top surface of the first conductive layer 130 and the bottom surface of the third conductive layer 132. For one embodiment, the second thickness $T_{12}$ may be a thickness of the first dielectric layer 110 defined between the top surface of the first conductive layer 130 and the bottom surface of the second conductive layer 131, where the first dielectric thickness $T_{11}$ may be greater than the second dielectric thickness $T_{12}$ within the first dielectric 110.

Likewise, as illustrated, the vias 140-141 and the second and third conductive layers 131-132 may be formed in the second dielectric layer 120 to have a first thickness $T_{21}$ and a second thickness $T_{22}$. For one embodiment, the second thickness $T_{22}$ may be a thickness of the second dielectric layer 120 defined between the top surface of the second conductive layer 131 and the bottom surface of the fourth conductive layer 133. For one embodiment, the first thickness $T_{21}$ may be a thickness of the second dielectric layer 120 defined between the top surface of the third conductive layer 132 and the bottom surface of the fourth conductive layer 133, where the first dielectric thickness $T_{21}$ may be less than the second dielectric thickness $T_{22}$ within the second dielectric 120. As such, for these embodiments, the package substrate includes first and second dielectrics 110 and 120 that have different dielectric thicknesses within the same respective dielectric (shown as $T_{11} > T_{12}$ and $T_{22} > T_{21}$) and within adjacent dielectrics 110 and 120, such as the second thickness $T_{22}$ of the second dielectric 120 may be greater than the first thickness $T_{11}$ of the first dielectric 110.

The thicknesses $T_{11}$, $T_{12}$, $T_{21}$, and $T_{22}$ of the first and second dielectric layers 110 and 120 may be formed to have one or more different thicknesses that allow for the desired line width and spacing between neighboring/adjacent conductive layers and/or dielectric layers to facilitate, for example, a single-ended routing structure and/or a differentiating routing structure in the package substrate 100. Embodiments of the package substrate 100 include a first thickness $T_{11}$ of the first dielectric layer 110 that is greater than a second thickness $T_{12}$ within the first dielectric layer 110, and a first thickness $T_{21}$ of the second dielectric layer 120 that is less than a second thickness $T_{22}$ within the second dielectric layer 120. For some embodiments, the first thickness $T_{11}$ may be approximately similar/equal to the second thickness $T_{22}$ if needed. For additional embodiments, the first thickness $T_{11}$ of the first dielectric layer 110 and the second thickness $T_{22}$ of the adjacent second dielectric layer 120 may each be adjusted to a specific (or desired) thickness—where $T_{11}$ is approximately less than $T_{22}$ or $T_{11}$ is approximately equal to $T_{22}$—based on the optimized electrical performance/requirements needed by the package substrate 100 (e.g., reduced crosstalk for one or more HSIO signals, improved transmission line design flexibility for microstrip/stripline routing layers, improved differential impedances between routing signals in one or more conductive layers, and/or design flexibility benefits of package passives designs, such as ACIs).

For one embodiment, the thickness $T_{11}$ may be approximately 70 μm or less. In a particular embodiment, the thickness $T_{11}$ may be approximately 15 μm or less. Likewise, for one embodiment, the thickness $T_{22}$ may be approximately 70 μm or less. In a particular embodiment, the thickness $T_{22}$ may be approximately 15 μm or less. Since lithographically defined conductive layers and vias (e.g., the third conductive layer 132 and vias 140) may be used according to the embodiments herein, the thicknesses of the vias and the conductive layers may be smaller than would otherwise be needed. Likewise, since a plasma etched/LPP/defined dielectric layer (e.g., the second dielectric layer 120) may be used according to the embodiments herein, a thickness of a dielectric layer in one or more regions of that dielectric layer may be smaller than other thicknesses within that dielectric layer.

As such, when the use of a conductive layer, a via, and/or a dielectric layer that can be formed with a reduced thickness are combined in the first and second dielectric layers 110 and 120, embodiments herein allow for the package substrate 100 to have a variation (or differentiation) in dielectric thicknesses in (i) the adjacent dielectric layers 110 and 120 at various regions (i.e., the variation of thicknesses are not limited to $T_{11}$, $T_{12}$, $T_{21}$, and $T_{22}$) and (ii) within a single dielectric layer (e.g., the second dielectric layer 120 has a second thickness $T_{22}$ that is larger than a first thickness $T_{21}$). In addition, when the use of varying thicknesses $T_{11}$, $T_{12}$, $T_{21}$, and $T_{22}$ are combined within the same dielectric and/or adjacent dielectric layers, embodiments of the package substrate 110 enable a reduced crosstalk for a HSIO interconnect and an increased HSIO communications speed in the package substrate 110.

A first process that enables the thicknesses of the dielectric layers to be different from each other is described with respect to FIGS. 2A-2G. Furthermore, a second process that also enables the thicknesses of the dielectric layers to be different from each other is described with respect to FIGS. 3A-J. These improved processes, such as the ones described herein and below, allow for a first dielectric to have a first thickness that is smaller than a second thickness of the second dielectric (or a first dielectric to have a first thickness that is larger than a second thickness of the second dielectric). As such, embodiments herein provide a package substrate that is optimized to have dielectric layers with varying dielectric thicknesses that enable each IC (e.g., a HSIO interconnect) in the package substrate to have improved electrical performances.

Note that the package substrate 100 may include fewer or additional packaging components based on the desired packaging design.

FIGS. 2A-2G are cross-sectional views of a process flow 200 to form a package substrate with a first dielectric having a first thickness that is less than a second thickness of a second dielectric, according to some embodiments. These embodiments as shown with respect to FIGS. 2A-2H provide the process flow 200 that enables a lithographic patterning process to define/form a via. These embodiments allow the height of the via to define a thickness of a dielectric layer, such as an ABF layer. The process flow 200 may also use an ABF planarization process and a laser/drilling process to handle different via depths, which may be combined to facilitate the varying thicknesses in the dielectric layers of the package substrate. For one embodiment, the package substrate shown in FIG. 2G may be similar to the package substrate 100 of FIG. 1.

One such embodiment is illustrated and described based on FIGS. 2A-2G, which illustrates cross-sectional views of a package substrate having adjacent dielectric layer with varying dielectric thicknesses. In the illustrated embodiments, the patterning of the dielectric layers on the package substrate is shown, however it is to be appreciated that illustrated features below may be formed using one or more different processing operations.

Referring back to FIG. 2A, a process flow 200 illustrates disposing a first conductive layer 230 on a dielectric 205. For one embodiment, the first conductive layer 230 may provide electrical connections to a lower dielectric layer (e.g., the dielectric 205) formed in the package substrate. According to an embodiment, the first conductive layer 230 and the dielectric 205 may be similar to the first conductive layer 130 and the dielectric 105 as described above in FIG. 1. For one embodiment, the first conductive layer 230 may include, but not limited to, signal lines, via pads, planes, and/or vias. In one embodiment, the first conductive layer 230 may be formed using a lithographic patterning and deposition process. According to an embodiment, the deposition process may be any suitable deposition process, such as electroless plating or the like.

Figure 2A:
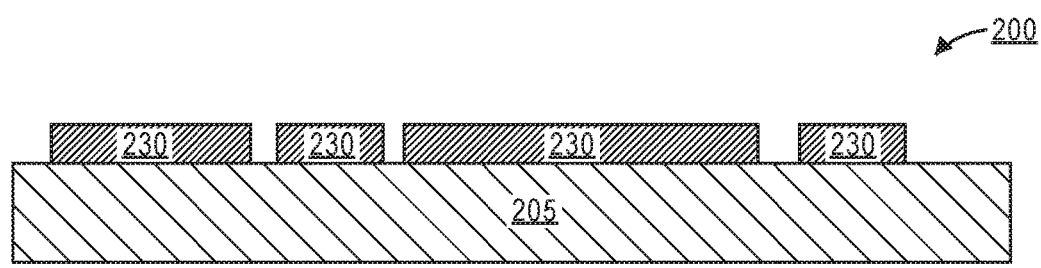
FIGS. 2A-2G are cross-sectional views of a process flow to form a package substrate with a first dielectric having a first thickness that is less than a second thickness of a second dielectric, according to some embodiments.
Figure 2B:
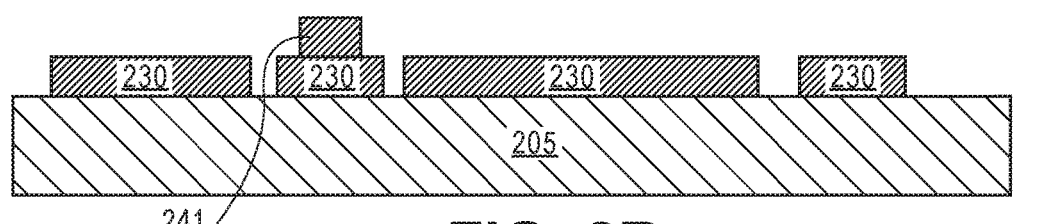

FIG. 2B illustrates the process flow 200 disposing (or forming) a via 241 (e.g., a plated via) on the first conductive layer 230. For one embodiment, the via 241 may be patterned and plated to a desired height on the via pad of the first conductive layer 230. For example, the desired height of the via 241 may be approximately 13 μm or greater. As described above, the height of the via 241 may define a thickness of a subsequent dielectric layer (or ABF layer) (e.g., as shown below with a thickness $T_1$ in a first dielectric 210 of FIG. 2C). For one embodiment, the via 241 may be formed using a lithographic patterning process.

Figure 2C:
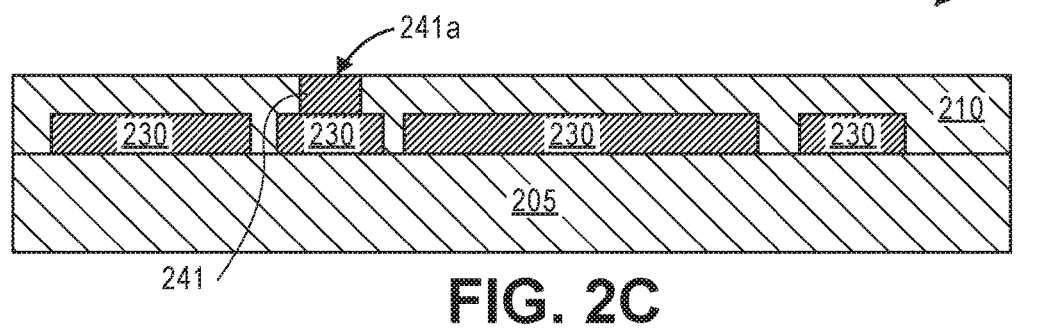

FIG. 2C illustrates the process flow 200 disposing a first dielectric layer 210 over the via 241, the first conductive layer 230, and the dielectric 205. For one embodiment, the first dielectric layer 210 may be an ABF layer. According to an embodiment, the first dielectric layer 210 may be formed with any suitable process, such as lamination or slit coating and curing. In an embodiment, the first dielectric layer 210 is formed to a thickness that will completely cover a top surface of the via 241 and the first conductive layer 230. As opposed to layer formation on crystalline structures (e.g., silicon substrates), each of the dielectric layers may not be highly uniform. Accordingly, the first dielectric layer 210 may be formed to a thickness that is greater than the combined height of the via 241 and the via pad 230 to ensure that the proper thickness is reached across the entire substrate. When the first dielectric layer 210 is formed above the combined height of the via 241 and the via pad 230, the first dielectric layer 210 may be planarized and a thinning process may then be used to expose a top surface 241a of the via 241, as illustrated in FIG. 2C.

In an embodiment, the thinning process may polish (or grind) the first dielectric layer 210 to expose the top surface 241a of the via 241, where the thinning process may be performed using a chemical mechanical polishing (CMP) process, a mechanical grinding process, a wet or dry etching process, a wet blast, a laser ablation (e.g., by using excimer laser), and/or a combination thereof. For example, the top surface 241a of the via 241 can be exposed by CMP and/or laser ablation. According to an additional embodiment, the depth controlled dielectric removal process may be performed only proximate to the via 241. For example, the thinning process of the first dielectric layer 210 may be localized proximate to the location of the via 241. In some embodiments, the thickness of the first dielectric layer 210 may be minimized in order to reduce the etching time required to expose the top surface 241a of the via 241.

Figure 2D:
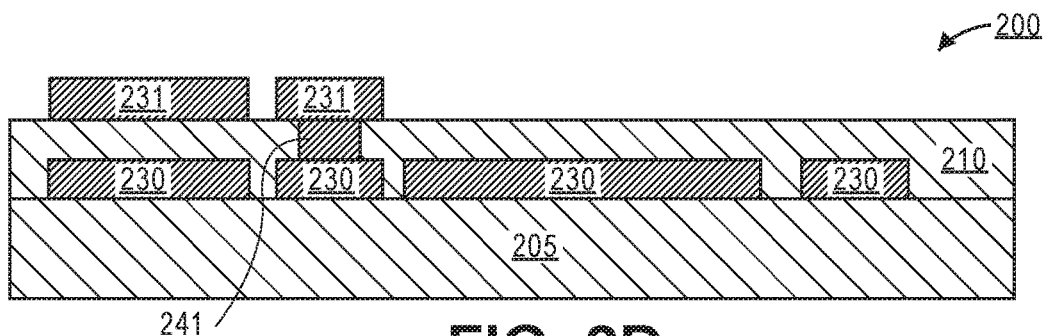

FIG. 2D illustrates the process flow 200 disposing a second conductive layer 231 on the via 241 and the first dielectric layer 210. The second conductive layer 231 may provide electrical connections to the first conductive layer 230 in the first dielectric layer 210. For one embodiment, the second conductive layer 231 may include, but not limited to, signal lines, via pads, planes, and/or vias. In one embodiment, the conductive layer 230 may be formed using a lithographic patterning and deposition process. According to an embodiment, the deposition process may be any suitable deposition process, such as electroless plating or the like.

Figure 2E:
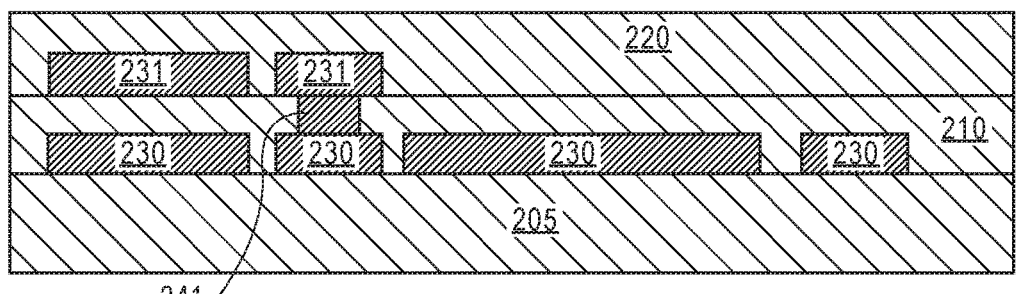

FIG. 2E illustrates the process flow 200 disposing a second dielectric layer 220 over the second conductive layer 231 and the first dielectric layer 210. For one embodiment, the second dielectric layer 220 may be an ABF layer. According to an embodiment, the second dielectric layer 220 may be formed with any suitable process, such as lamination or slit coating and curing. In an embodiment, the second dielectric layer 220 is formed to a thickness that will completely cover the top surfaces of the second conductive layer 231. According to one embodiment, the second dielectric layer 220 may be similar to the first dielectric layer 210 described above.

Figure 2F:
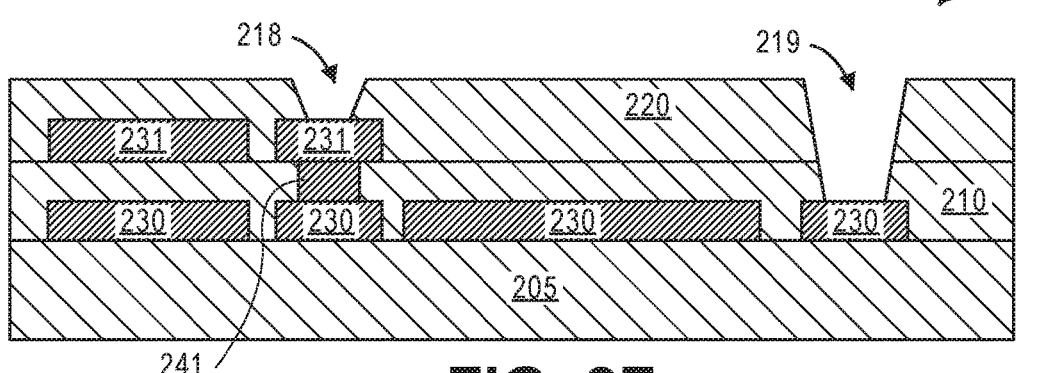

FIG. 2F illustrates the process flow 200 patterning the second dielectric layer 220 to form a via opening 218 that exposes a top surface of the via pad 231, and a via opening 219 that exposes a top surface of the via pad 230. For one embodiment, the second dielectric layer 220 is patterned to form the via opening 218 that provides an opening through the second dielectric layer 220 to the via pad of the second conductive layer 231. For one embodiment, the second dielectric layer 220 is patterned to form the via opening 219 that provides an opening through the first and second dielectric layers 210 and 220 to the via pad of the first conductive layer 230.

According to other embodiments, the patterning of the second dielectric layer 220 may include via openings that provide an opening through at least one of the second dielectric layer 220 and both the second and first dielectric layers 220 and 210 to a signal line, a via pad, or a plane (or any combination thereof) in at least one of the second conductive layer 231 and the first conductive layer 230. According to embodiments, the via openings 218-219 in the first and second dielectric layers 210 and 220 may be patterned with a patterning process such as direct laser writing, laser projection patterning, plasma etching, or other known patterning processes.

In an embodiment, the via opening 218 may be formed with a first patterning process, and the via opening 219 may be formed with a second patterning process. The first patterning process used to form the via opening 218 may be a different patterning process than the second patterning process to form the via opening 219. Other embodiments may also include that the first and second patterning processes use the same process. For one embodiment, the via openings 218 and 219 may have approximately the same width. For another embodiment, the via opening 218 may have a different width than a width of the via opening 219.

Figure 2G:
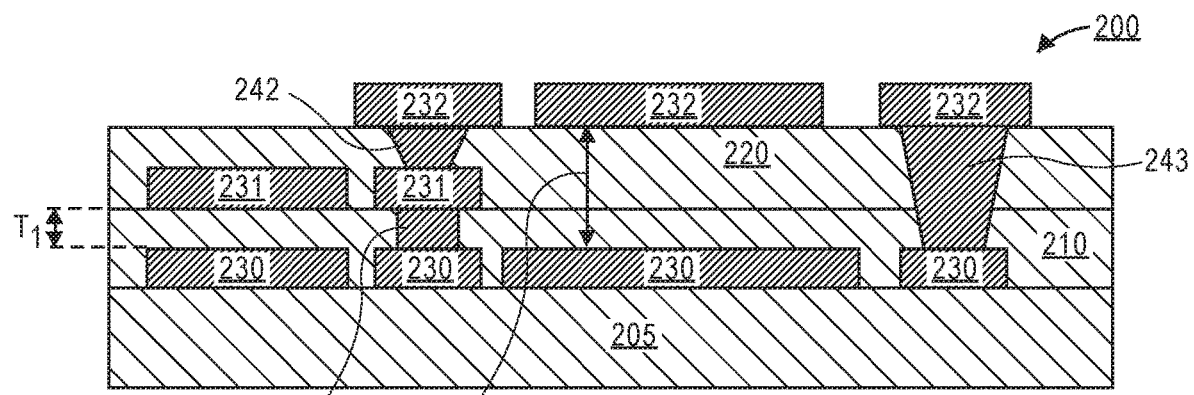

FIG. 2G illustrates the process flow 200 depositing a conductive material into the via openings 218 and 219 to form vias 242 and 243 (e.g., laser vias) on the package substrate. For one embodiment, the thickness of the via 242 is greater than the thickness of the via 243. For other embodiments, the thickness of the via 242 may be approximately similar to or less than the thickness of the via 243 if needed. In addition, the process flow 200 illustrates disposing a third conductive layer 232 on the vias 242 and 243 and the second dielectric layer 220. The third conductive layer 232 may provide electrical connections to the first conductive layer 230 in the first dielectric layer 210 and/or the second conductive layer 231 in the second dielectric layer 220. For one embodiment, the third conductive layer 232 may include, but not limited to, signal lines, via pads, planes, and/or vias.

For one embodiment, the vias 242-243 and the third conductive layer 232 may be formed using a semi-additive patterning (SAP) process. For example, the second dielectric layer 220 may be metallized with an electroless plating process. Embodiments include an electroless plating process for depositing (or disposing) the conductive material, such as copper. As shown, the electroless plating process deposits the metal conductive material into via openings 218-219 to form the vias 242-243 and the third conductive layer 232. For one embodiment, the third conductive layer 232 may be planarized if needed.

Furthermore, as illustrated, the via 241 and the first conductive layer 230 may be formed in the first dielectric layer 210 to have a first thickness $T_1$. For one embodiment, the first thickness $T_1$ may be a thickness of the first dielectric layer 210 defined between the top surface of the first conductive layer 230 and the bottom surface of the second conductive layer 231. Likewise, the vias 241-243 and the second conductive layer 231 may be formed in the first and second dielectric layers 210 and 220 to have a second thickness $T_2$. For one embodiment, the second thickness $T_2$ may be a combined thickness of the first and second dielectric layers 210 and 220 defined between the top surface of the first conductive layer 230 and the bottom surface of the third conductive layer 232.

Embodiments of the package substrate as shown in FIG. 2G include the first thickness $T_1$ of the first dielectric layer 210 that is less than the second thickness $T_2$ of the adjacent first and second dielectric layers 210 and 220. Alternatively, for an embodiment, the first thickness $T_1$ may be approximately similar/equal to the second thickness $T_2$ if needed. For additional embodiments, the first thickness $T_1$ of the first dielectric layer 210 and the second thickness $T_2$ of the adjacent dielectric layers 210 and 220 may each be adjusted to a specific (or desired) thickness—where $T_1$ is approximately less than $T_2$ or $T_1$ is approximately equal to $T_2$—based on the optimized electrical performance/requirements needed by the package substrate (e.g., reduced crosstalk for one or more HSIO signals, improved transmission line design flexibility for microstrip/stripline routing layers, improved differential impedances between signals in one or more conductive layers, and/or design flexibility to form an ACI in the package substrate).

Note that the process flow 200 as shown with FIGS. 2A-2H may include fewer or additional packaging components and steps based on the desired packaging design.

FIGS. 3A-3J are cross-sectional views of a process flow 300 to form a package substrate with a first dielectric having a first thickness that is less than a second thickness of a second dielectric, according to some embodiments. These embodiments as shown with respect to FIGS. 3A-3J provide the process flow 300 that combines a zero misalignment lithographic patterning process and a plasma etching process to define/form one or more vias (e.g., ZMVs, stacked vias, etc.). These embodiments allow the variation in dielectrics to be formed using the plasma etching (or a laser projection patterning (LPP)) of a dielectric in presence of a resist. For example, the amount of the dielectric layer to be etched may be determined from the local requirement of the dielectric thickness at that specific region of the dielectric layer. The process flow 300 may also use a dielectric planarization process and a laser/drilling process to handle different via depths, which may be combined to facilitate the varying thicknesses in the dielectric layers of the package substrate. For one embodiment, the package substrate shown in FIG. 3J may be similar to the package substrate 100 of FIG. 1.

One such embodiment is illustrated and described based on FIGS. 3A-3J, which illustrates cross-sectional views of a package substrate having adjacent dielectric layer with varying dielectric thicknesses. In the illustrated embodiments, the patterning of the dielectric layers on the package substrate is shown, however it is to be appreciated that illustrated features below may be formed using one or more different processing operations.

Figure 3A:
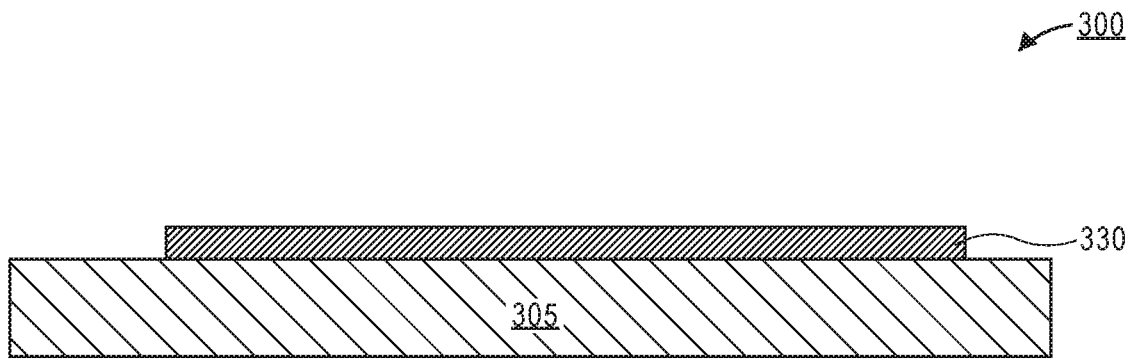
FIGS. 3A-3J are cross-sectional views of a process flow to form a package substrate having a plurality of vias, one or more conductive layers, a dielectric, a first dielectric, and a second dielectric, including varying dielectric thicknesses with each of the first and second dielectrics, according to some embodiments.

Referring now to FIG. 3A, a process flow 300 illustrates disposing a first conductive layer 330 on a dielectric 305. According to an embodiment, the first conductive layer 330 and the dielectric 305 may be similar to the first conductive layer 130 and the dielectric 105 as described above in FIG. 1. For one embodiment, the first conductive layer 330 may include, but not limited to, signal lines, via pads, planes, and/or vias. In one embodiment, the first conductive layer 330 may be formed using a lithographic patterning and deposition process. According to an embodiment, the deposition process may be any suitable deposition process, such as electroless plating or the like.

Figure 3B:
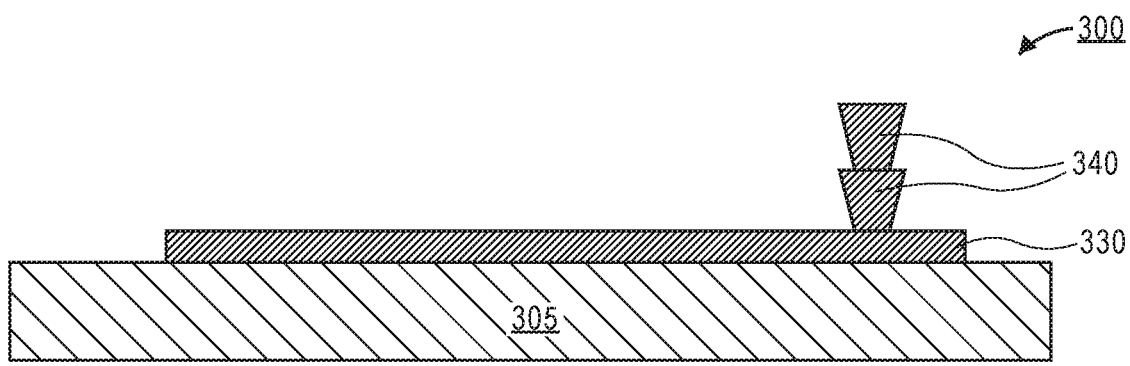

FIG. 3B illustrates the process flow 300 disposing (or forming) one or more stacked ZMVs 340 on the first conductive layer 330. For one embodiment, the stacked ZMVs 340 may be two ZMVs that are plated using a zero misalignment laser process. For example, implementing the zero misalignment litho process to form the stacked ZMVs 340 allows reduction in via sizes and avoids misalignment. For other embodiments, the ZMV 340 may include a single ZMV or two or more ZMVs based on a desired thickness (e.g., a first thickness $T_{11}$) of a subsequent dielectric layer (e.g., the first dielectric layer 310). For one embodiment, the stacked ZMVs 340 are embedded within the same first dielectric layer 310.

For one embodiment, the stacked ZMVs 340 may be patterned and plated to a desired height on the plane of the first conductive layer 330 to define the thickness of the subsequent first dielectric layer (as shown with the thickness $T_{11}$ in FIG. 1). In addition, the ZMVs 340 may be located at any desired region on the first conductive layer 330. For alternate embodiments, the ZMVs 340 may be formed with a via pad above, in between, or below the ZMVs 340 if needed.

Figure 3C:
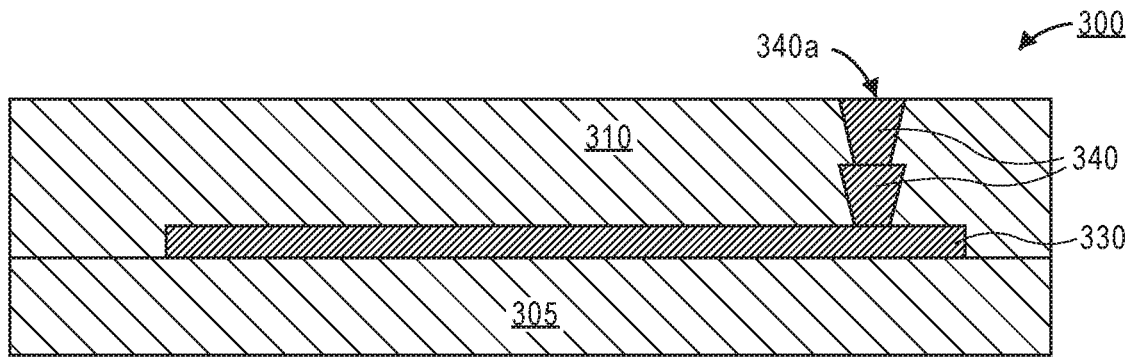

FIG. 3C illustrates the process flow 300 disposing a first dielectric layer 310 over the ZMVs 340, the first conductive layer 330, and the dielectric 305. For one embodiment, the first dielectric layer 310 may be an ABF layer. According to an embodiment, the first dielectric layer 310 may be formed with any suitable process, such as lamination or slit coating and curing. In an embodiment, the first dielectric layer 310 is formed to a thickness that will completely cover a top surface of the top ZMV 340 and the first conductive layer 330. Accordingly, the first dielectric layer 310 may be formed to a thickness that is greater than the combined height of the ZMVs 340 and the first conductive layer 330 to ensure that the proper thickness is reached across the entire substrate. For one embodiment, the first dielectric layer 310 may be planarized, and a thinning process may then be used to expose a top surface 340a of the ZMVs 340, as illustrated in FIG. 3C. In an embodiment, the thinning process may polish (or grind) the first dielectric layer 310 to expose the top surface 341a of the ZMVs 341, where the thinning process is similar to the thinning process described above.

Figure 3D:
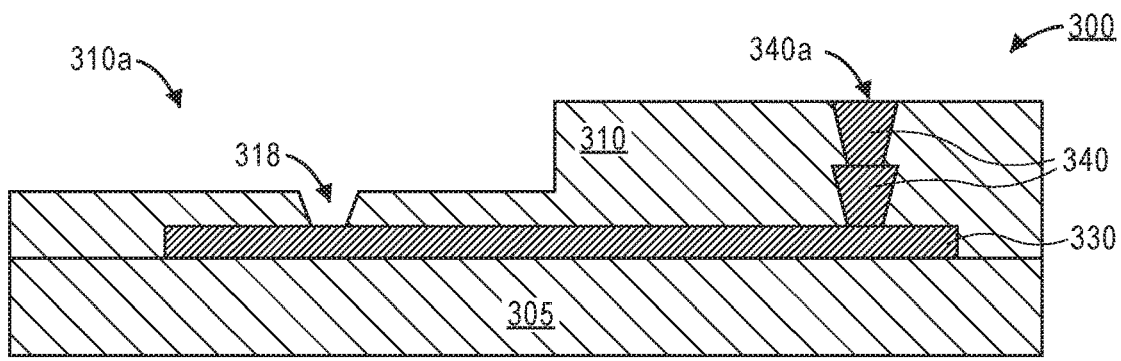

FIG. 3D illustrates the process flow 300 patterning the first conductive layer 330 to form an opening 310a in the first conductive layer 330. For one embodiment, the first dielectric layer 310 is etched to from the opening 310a to a desired thickness. For one embodiment, the first dielectric layer 310 may be patterned with an anisotropic etching process that provides substantially vertical sidewalls for the opening 310a in the first dielectric layer 310. For example, the first dielectric layer 310 may be etched with a dry etching process, such as a plasma etch. The dry etching process may also be combined with a photoresist mask to etch the first dielectric layer 310. In such an embodiment, the opening 310a may be patterned into the resist mask, which can then be used as a mask for etching the pattern of the opening 310a into the first dielectric layer 310. In another embodiment, the first dielectric layer 310 may be patterned using a LLP to form the opening 310a (or the cavity 310a).

The process flow 300 also illustrates patterning the first dielectric layer 310 to form a via opening 318 that exposes a top surface of the first conductive layer 330. For one embodiment, the via opening 318 may provide an opening through the first dielectric layer 310 to the plane in the first conductive layer 330. According to embodiments, the via opening 318 in the first dielectric layer 310 may be patterned with a patterning process such as direct laser writing, laser projection patterning, plasma etching, or other known patterning processes.

Figure 3E:
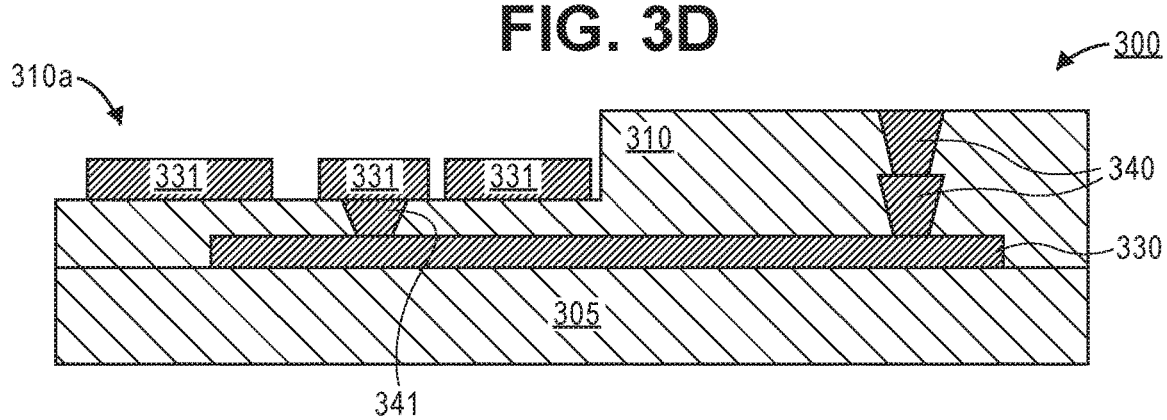

FIG. 3E illustrates the process flow 300 depositing a conductive material into the via opening 318 to form a via 341 (e.g., a laser via) on the package substrate. In addition, the process flow 300 illustrates disposing a second conductive layer 331 on the via 341 and the opening 310a of the first dielectric layer 310. For one embodiment, the second conductive layer 331 is disposed in the opening 310a of the first dielectric layer 310. For example, the topmost surface of the first dielectric layer 310 (as shown on the right side of package substrate) has a z-height that is greater than a z-height of the top surface of the second conductive layer 331 disposed in the opening 310a of the first dielectric layer 310. The second conductive layer 331 may provide electrical connections to the first conductive layer 330 in the first dielectric layer 310. For one embodiment, the second conductive layer 331 may include, but not limited to, signal lines, via pads, planes, and/or vias. For one embodiment, the via 341 and the second conductive layer 331 may be formed using a SAP process as described above. For one embodiment, the second conductive layer 331 may be planarized if needed.

Figure 3F:
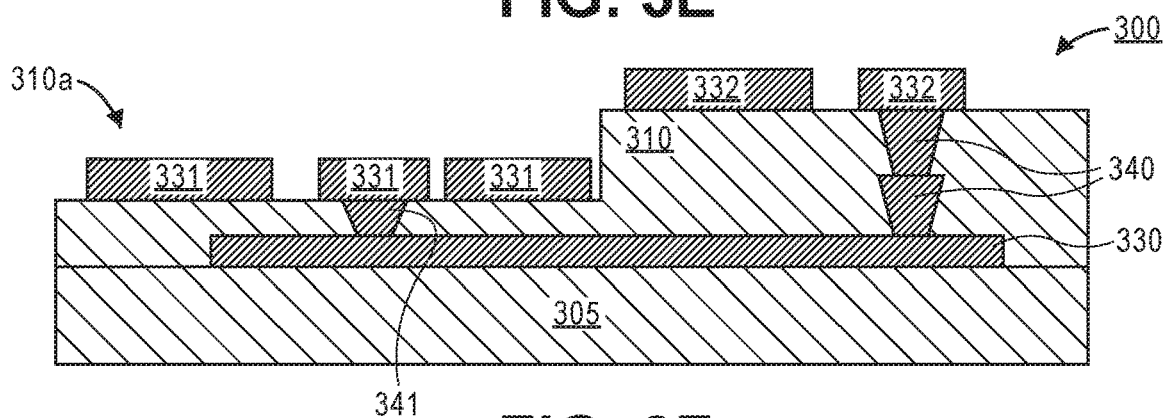

FIG. 3F illustrates the process flow 300 disposing a third conductive layer 332 on the ZMVs 340 and the topmost surface of first dielectric layer 310. For one embodiment, the topmost surface of the third conductive layer 332 has a z-height that is greater than a z-height of the top surface of the second conductive layer 331 disposed in the opening 310a of the first dielectric layer 310. The third conductive layer 332 may provide electrical connections to the first and second conductive layers 330-331. For one embodiment, the third conductive layer 332 may include, but not limited to, signal lines, via pads, planes, and/or vias. For one embodiment, the third conductive layer 332 may be formed using a lithographic patterning and plating process as described above. For one embodiment, the third conductive layer 332 may be planarized if needed.

Figure 3G:
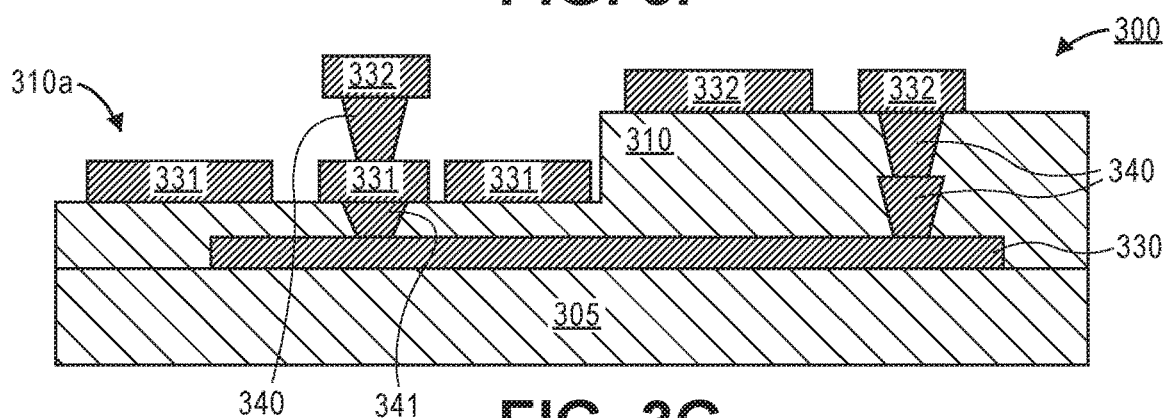

FIG. 3G illustrates the process flow 300 disposing a ZMV 340 and a ZMV pad 332 on the via pad 331 in the opening 310a of the second conductive layer 331. For one embodiment, the ZMV 340 may be disposed on the via pad 331, and then the ZMV pad 332 may be disposed on the ZMV 340, where the ZMV 340 and the ZMV pad 332 are formed using a zero misalignment lithographic patterning and plating process (as described above) that enables an electrical connection to a subsequent upper conductive layer (e.g., a fourth conductive layer 333 as shown in FIG. 3J). For one embodiment, the topmost surface of the ZMV pad 332 (on the left side and the opening 310a of the package substrate) has a z-height that is approximately equal to or greater than a z-height of the top surface of the third conductive layer 332 that is disposed on the topmost surface of the first dielectric layer 310 (on the right side of the package substrate).

Figure 3H:
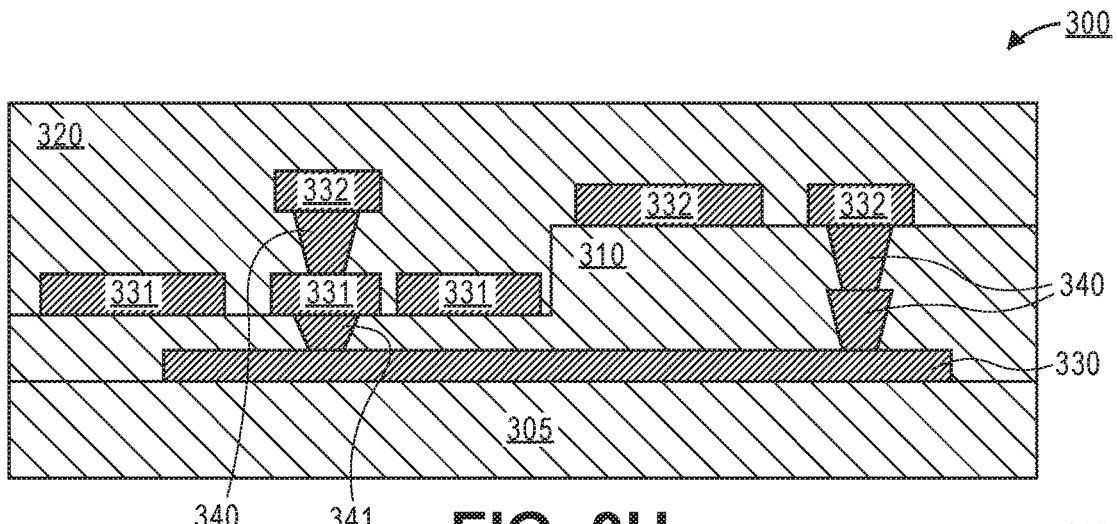

FIG. 3H illustrates the process flow 200 disposing a second dielectric layer 320 over the second conductive layer 331, the third conductive layer 332, and the first dielectric layer 210. For one embodiment, the second dielectric layer 320 may be an ABF layer. According to an embodiment, the second dielectric layer 320 may be formed with any suitable process, such as lamination or slit coating and curing. In an embodiment, the second dielectric layer 320 is formed to a thickness that will completely cover the top surfaces of the third conductive layer 332. According to one embodiment, the second dielectric layer 320 may be similar to the first dielectric layer 310 described above.

Figure 3I:
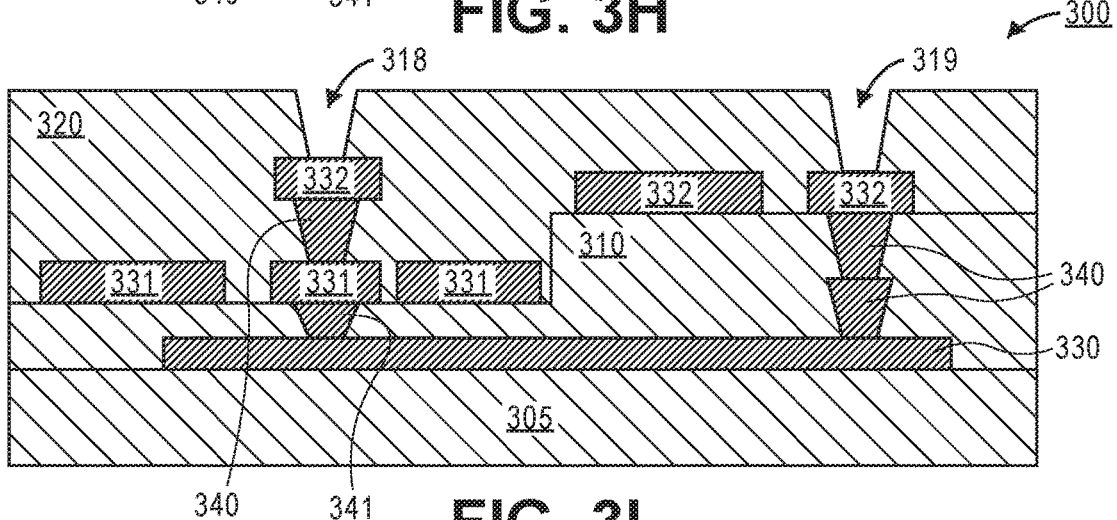
Figure 3J:
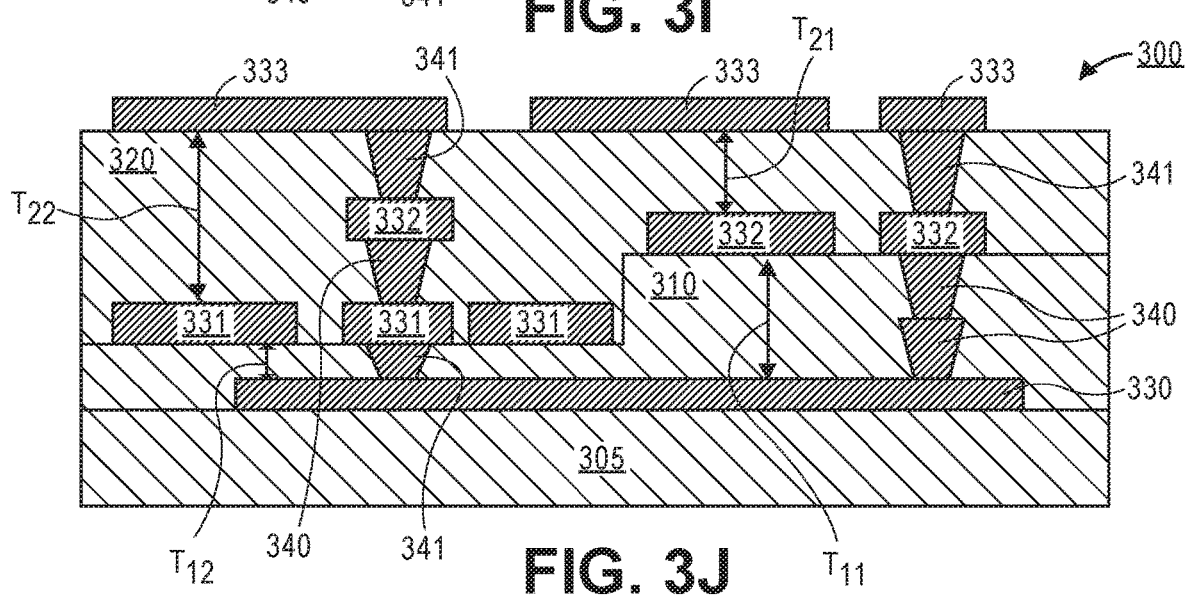

FIG. 3I illustrates the process flow 300 patterning the second dielectric layer 220 to form a via opening 318 that exposes a top surface of the ZMV pad 332 (on the left), and a via opening 319 that exposes a top surface of the via pad 332 (on the right). For one embodiment, the second dielectric layer 320 is patterned to form the via opening 318 that provides an opening through the second dielectric layer 320 to the ZMV pad of the third conductive layer 332. For one embodiment, the second dielectric layer 320 is patterned to form the via opening 319 that provides an opening through the second dielectric layer 320 to the via pad of the third conductive layer 332.

According to some embodiments, the second dielectric layer 320 may be patterned with a patterning process such as direct laser writing, laser projection patterning, plasma etching, or other known patterning processes. In an embodiment, the via opening 318 may be formed with a first patterning process, and the via opening 319 may be formed with a second patterning process. The first patterning process used to form the via opening 318 may be a different patterning process than the second patterning process to form the via opening 319. Other embodiments may also include that the first and second patterning processes use the same process. For one embodiment, the via openings 318 and 319 may have approximately the same width. For another embodiment, the via opening 318 may have a different width than a width of the via opening 319.

FIG. 3J illustrates the process flow 300 patterning depositing a conductive material into the via openings 318 and 319 to form vias 341 (e.g., laser vias) in the second dielectric layer 320 on the package substrate. For one embodiment, the thickness of the via 341 (on the right side and formed in the via opening 319) is greater than the thickness of the via 341 (on the left side and formed on the ZMV pad 332). For other embodiments, the thickness of the via 341 (on the right side and formed in the via opening 319) may be approximately similar to or less than the thickness of the via 341 (on the left side and formed on the ZMV pad 332) if needed. For one embodiment, the stacked vias 340-341 formed between the second conductive layers 331 and 333 are embedded within the same second dielectric layer 320, which also provide the desired thickness $T_{22}$ of the second dielectric layer 320.

In addition, the process flow 300 illustrates disposing a fourth conductive layer 333 on the vias 341 and the second dielectric layer 320. The fourth conductive layer 333 may provide electrical connections to the first, second, and/or third conductive layers 330-332 in the first dielectric layer 310 and/or in the second dielectric layer 320. For one embodiment, the fourth conductive layer 333 may include, but not limited to, signal lines, via pads, planes, and/or vias. For one embodiment, the vias 341 in the second dielectric layer 320 and the fourth conductive layer 333 may be formed using a SAP process as described above. For one embodiment, the fourth conductive layer 333 may be planarized if needed.

Furthermore, as illustrated, the ZMVs 340, the via 341, and the first conductive layer 330 may be formed in the first dielectric layer 310 to have a first thickness $T_{11}$ and a second thickness $T_{12}$, where the first dielectric thickness $T_{11}$ may be greater than the second dielectric thickness $T_{12}$ within the first dielectric 110. Likewise, the vias 340-341 and the second and third conductive layers 331-332 may be formed in the second dielectric layer 310 to have a first thickness $T_{21}$ and a second thickness $T_{22}$, where the first dielectric thickness $T_{21}$ may be less than the second dielectric thickness $T_{22}$ within the second dielectric 320. As such, for these embodiments, the package substrate includes first and second dielectrics 310 and 320 that have different dielectric thicknesses within the same respective dielectric (shown as $T_{11}>T_{12}$ and $T_{22}>T_{21}$) and within adjacent dielectrics 110 and 120 (shown as $T_{22}>T_{11}$). Note that the thicknesses $T_{11}$, $T_{12}$, $T_{21}$, and $T_{22}$ may be defined at various regions within the two adjacent dielectric layers 310 and 320, as such the same processes as described herein may be used in these other various regions of the adjacent dielectric layers 310 and 320 to provide the needed thicknesses at these other regions.

The thicknesses $T_{11}$, $T_{12}$, $T_{21}$, and $T_{22}$ of the first and second dielectric layers 310 and 320 may be formed to have one or more different thicknesses that allow for the desired line width and spacing between neighboring/adjacent conductive layers and/or dielectric layers to facilitate, for example, a single-ended routing structure and/or a differentiating routing structure in the package substrate of FIG. 3J. Embodiments of the package substrate include a first thickness $T_{11}$ of the first dielectric layer 310 that is greater than a second thickness $T_{12}$ within the first dielectric layer 310, a first thickness $T_{21}$ of the second dielectric layer 320 that is less than a second thickness $T_{22}$ within the second dielectric layer 320, and the second thickness $T_{22}$ of the second dielectric 320 is greater than the first thickness $T_{11}$ of the first dielectric layer 310. Alternatively, for an embodiment, the first thickness $T_{11}$ may be approximately similar/equal to the second thickness $T_{22}$ if needed. For additional embodiments, the first thickness $T_{11}$ of the first dielectric layer 310 and the second thickness $T_{22}$ of the adjacent second dielectric layer 320 may each be adjusted to a specific (or desired) thickness based on the optimized electrical performance/requirements needed by the package substrate 100 (e.g., reduced crosstalk for one or more HSIO signals, improved transmission line design flexibility for microstrip/stripline routing layers, improved differential impedances between routing signals in one or more conductive layers, and/or design flexibility benefits of package passives designs, such as ACIs).

For one embodiment, the thickness $T_{11}$ may be approximately 70 μm or less (e.g., the thickness $T_{11}$ may be defined by the thickest existing/available build-up layer film). In a particular embodiment, the thickness $T_1$ may be approximately 15 μm or less. Likewise, for one embodiment, the thickness $T_2$ may be approximately 70 μm or less. In a particular embodiment, the thickness $T_2$ may be approximately 15 μm or less. Since lithographically defined conductive layers and vias (e.g., the third conductive layer 332 and the ZMVs 340) may be used according to the embodiments herein, the thicknesses of the vias and the conductive layers may be smaller than would otherwise be needed. Likewise, since an etched/patterned/defined dielectric layer (e.g., the second dielectric layer 320) may be used according to the embodiments herein, a thickness of a dielectric layer in one or more regions of that dielectric layer may be smaller than other thicknesses within that dielectric layer.

Note that the process flow 300 as shown with FIGS. 3A-3J may include fewer or additional packaging components based on the desired packaging design.

FIG. 4 is a cross-sectional view of a semiconductor package 400 having a package substrate 402 that may include a build-up structure having one or more varying thicknesses within the same dielectric and/or adjacent dielectric layers (as described above), according to one embodiment. Note that the semiconductor package 400 is not limited to the illustrated semiconductor packaged system, and thus may be designed/formed with fewer, alternate, or additional packaging components and/or with different interconnecting structures. Also note that the embodiments described herein allow variations in dielectric thicknesses anywhere in (or throughout) the substrate (i.e., the variations are not limited to the adjacent first and second dielectrics), including in applications that may need multiple build-up layers (e.g., ten build-up dielectric layers).

For one embodiment, FIG. 4 illustrates the semiconductor package 400 including a die 414, a substrate 412 (or an interposer), interconnect structures (e.g., the plurality of bumps disposed below the die 414 and the interposer 412), and the package substrate 402, where the substrate 412 and/or the packaged substrate 402 may have build-up structures with one or more varying thicknesses within the same dielectric and/or adjacent dielectric layers, according to some embodiments. For one embodiment, the semiconductor package 400 may include one or more build-up structures implementing a first dielectric having a first thickness that varies from a second thickness of a first/second dielectric based on optimizing each IC of the build-up structure to have improved electrical performances (e.g., the thicknesses $T_{11}$ and $T_{22}$ as shown in FIGS. 1, 2G, and 3J). Note that the package substrate 402 and/or the substrate 412 may be similar to the package substrate 100 of FIG. 1 and the package substrates of FIGS. 2G and 3J.

According to one embodiment, the semiconductor package 400 is merely one example of an embodiment of a semiconductor packaged system. For one embodiment, the semiconductor package 400 may include a land grid array (LGA) package and/or a pin grid array (PGA) package. For one embodiment, a die 414 (or an integrated circuit die) is coupled to a substrate 412 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 414, the substrate 412, and the package substrate 402 may be coupled/connected using anisotropic conductive film (ACF) rather than using solder bumps/joints.

For one embodiment, the substrate 412 may be, but is not limited to, a silicon interposer and/or a die with through silicon vias (TSVs). For an alternate embodiment, the semiconductor package 400 may omit the interposer/substrate 412. For other embodiments, the semiconductor package may include an integrated heat spreader/lid extending from the package substrate 402 to the top of the die 414.

For some embodiments, the semiconductor package 400 may have the die 414 disposed on the interposer 412, where both the stacked die 414 and interposer 412 are disposed on a package substrate 402. According to some embodiments, the package substrate 402 may include, but is not limited to, a package, a substrate, a printed circuit board (PCB), and a motherboard. For one embodiment, the package substrate 402 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers (e.g., the first and second dielectrics 110 and 120 of FIG. 1), where each dielectric layer can be a photosensitive dielectric layer (e.g., an ABF layer). For some embodiments, holes may be drilled in the PCB 402. For one embodiment, the PCB 402 may also include conductive layers (e.g., the first-fourth conductive layers 130-133 of FIG. 1), including copper lines/traces, metallic pads, vias, planes, and holes.

For one embodiment, the die 414 may include, but is not limited to, a semiconductor die, an electronic device (e.g., a wireless device), an integrated circuit, a central processing unit (CPU), a microprocessor, a platform controller hub (PCH), a memory, and a field-programmable gate array (FPGA). The die 414 may be formed from a material such as silicon and have circuitry thereon that is to be coupled to the interposer 412. Although some embodiments are not limited in this regard, the package substrate 402 may in turn be coupled to another body, for example, a computer motherboard. One or more connections between the package substrate 402, the interposer 412, and the die 414—e.g., including some or all of bumps 416, 418, and 420—may include one or more interconnect structures and underfill layers 426 and 428. In some embodiments, these interconnect structures (or connections) may variously comprise an alloy of nickel, palladium, and tin (and, in some embodiments, Cu).

Connections between the package substrate 402 and another body may be made using any suitable structure, such as the illustrative bumps 420 shown. The package substrate 402 may include a variety of electronic structures formed thereon or therein. The interposer 412 may also include electronic structures formed thereon or therein, which may be used to couple the die 414 to the package substrate 402. For one embodiment, one or more different materials may be used for forming the package substrate 402 and the interposer 412. In certain embodiments, the package substrate 402 is an organic substrate made up of one or more layers of polymer base material, with conducting regions for transmitting signals. In certain embodiments, the interposer 412 is made up of a ceramic base material including metal regions for transmitting signals. Although some embodiments are not limited in this regard, the semiconductor package 400 may include gap control structures 430—e.g., positioned between the package substrate 402 and the interposer 412. Such gap control structures 430 may mitigate a change in the height of the gap between the package substrate 402 and the interposer 412, which otherwise might occur during reflowing while die 414 is attached to interposer 412. Note that the semiconductor package 400 includes an underfill material 428 between the interposer 412 and the die 414, and an underflow material 426 between the package substrate 402 and the interposer 412. For one embodiment, the underfill materials (or layers) 426 and 428 may be one or more polymers that are injected between the layers. For other embodiments, the underfill materials may be molded underfills (MUF).

Note that the semiconductor package 400 may include fewer or additional packaging components based on the desired packaging design.

Figure 5:
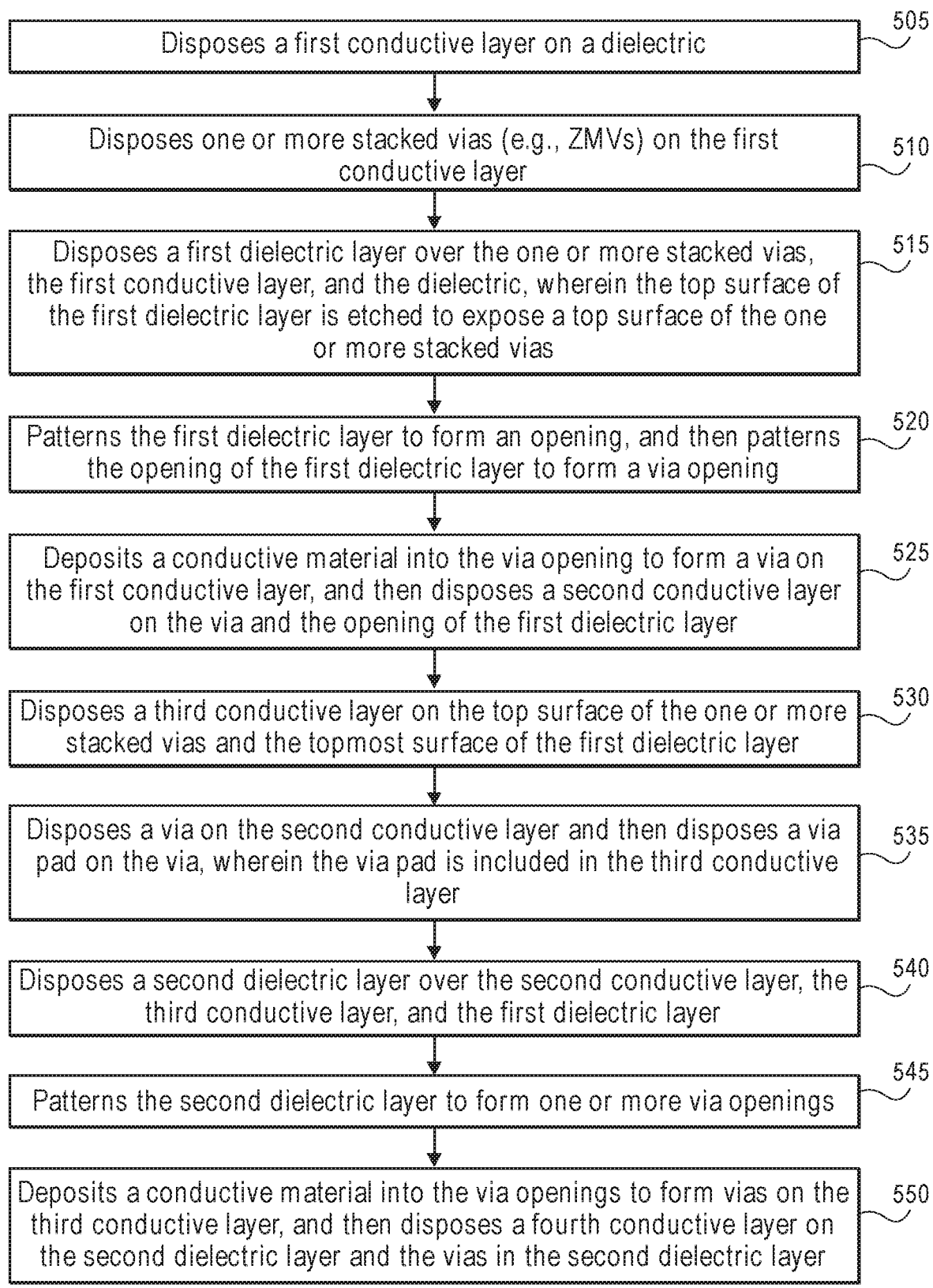
FIG. 5 is a process flow illustrating a method of forming a package substrate having a plurality of vias, one or more conductive layers, a dielectric, a first dielectric, and a second dielectric, including varying dielectric thicknesses with each of the first and second dielectrics, according to one embodiment.

FIG. 5 is a process flow illustrating a method of forming a package substrate with a first dielectric having a first thickness that is less than a second thickness of a second dielectric, according to one embodiment. For one embodiment, the process flow 500 includes one or more steps used to form the package substrate 100 of FIG. 1 and the package substrate of FIG. 3J as described herein.

At block 505, the process flow 500 disposes a first conductive layer on a dielectric (e.g., as shown in FIG. 3A). At block 510, the process flow 500 disposes one or more stacked vias (e.g., ZMVs) on the first conductive layer (e.g., as shown in FIG. 3B). At block 515, the process flow 500 disposes a first dielectric layer over the one or more stacked vias, the first conductive layer, and the dielectric (e.g., as shown in FIG. 3C). Additionally, the process flow 500 etches the top surface of the first dielectric layer to expose a top surface of the one or more stacked vias (e.g., as shown in FIG. 3C).

At block 520, the process flow 500 patterns the first dielectric layer to form an opening, and then patterns the opening of the first dielectric layer to form a via opening (e.g., as shown in FIG. 3D). At block 525, the process flow 500 deposits a conductive material into the via opening to form a via on the first conductive layer (e.g., as shown in FIG. 3E). Additionally, the process flow 500 disposes a second conductive layer on the via and the opening of the first dielectric layer (e.g., as shown in FIG. 3E). At block 530, the process flow 500 disposes a third conductive layer on the top surface of the one or more stacked vias and the topmost surface of the first dielectric layer (e.g., as shown in FIG. 3F).

At block 535, the process flow 500 disposes a via on the second conductive layer and then disposes a via pad on the via (e.g., as shown in FIG. 3G). For one embodiment, the via pad may be included in the third conductive layer (e.g., as shown in FIG. 3G). At block 540, the process flow 500 disposes a second dielectric layer over the second conductive layer, the third conductive layer, and the first dielectric layer (e.g., as shown in FIG. 3H). At block 545, the process flow 500 patterns the second dielectric layer to form one or more via openings (e.g., as shown in FIG. 3I). At block 550, the process flow 500 deposits a conductive material into the via openings to form vias on the third conductive layer (e.g., as shown in FIG. 3J). Additionally, the process flow 500 disposes a fourth conductive layer on the second dielectric layer and the vias in the second dielectric layer (e.g., as shown in FIG. 3J).

Note that the semiconductor package formed by process flow 500 may include fewer or additional packaging components based on the desired packaging design (e.g., as shown in FIGS. 1-3).

Figure 6:
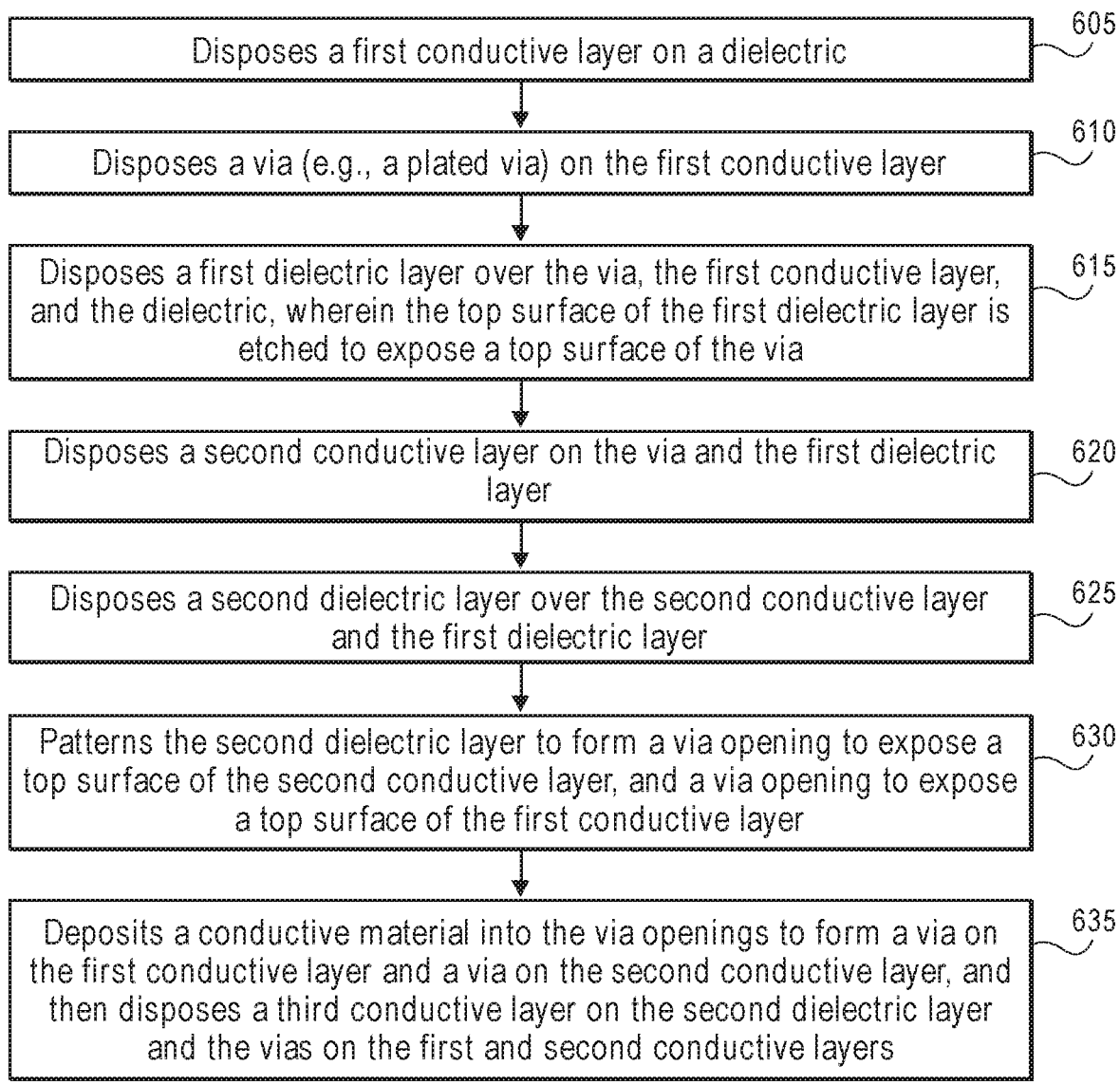
FIG. 6 is a process flow illustrating a method of forming a package substrate with a first dielectric having a first thickness that is less than a second thickness of a second dielectric, according to one embodiment.

FIG. 6 is a process flow illustrating a method of forming a package substrate with a first dielectric having a first thickness that is less than a second thickness of a second dielectric with a plasma etching, according to one embodiment. For one embodiment, the process flow 600 includes one or more steps used to form the package substrate of FIG. 2G as described herein.

At block 605, the process flow 600 disposes a first conductive layer on a dielectric (e.g., as shown in FIG. 2A).

At block 610, the process flow 600 disposes a via (e.g., a plated via) on the first conductive layer (e.g., as shown in FIG. 2B). At block 615, the process flow 600 disposes a first dielectric layer over the via, the first conductive layer, and the dielectric (e.g., as shown in FIG. 2C). Additionally, the process flow 600 etches the top surface of the first dielectric layer to expose a top surface of the via (e.g., as shown in FIG. 2C). As noted above, the process flow can use CMP to expose the top surface of the via.

At block 620, the process flow 600 disposes a second conductive layer on the via and the first dielectric layer (e.g., as shown in FIG. 2D). At block 625, the process flow 600 disposes a second dielectric layer over the second conductive layer and the first dielectric layer (e.g., as shown in FIG. 2E). At block 630, the process flow 600 patterns the second dielectric layer to form a via opening to expose a top surface of the second conductive layer, and a via opening to expose a top surface of the first conductive layer (e.g., as shown in FIG. 2F).

At block 635, the process flow 600 deposits a conductive material into the via openings to form a via on the first conductive layer and a via on the second conductive layer (e.g., as shown in FIG. 2G). Additionally, the process flow 600 disposes a third conductive layer on the second dielectric layer and the vias on the first and second conductive layers (e.g., as shown in FIG. 2G).

Note that the semiconductor package formed by process flow 600 may include fewer or additional packaging components based on the desired packaging design (e.g., as shown in FIGS. 1-3).

Figure 7:
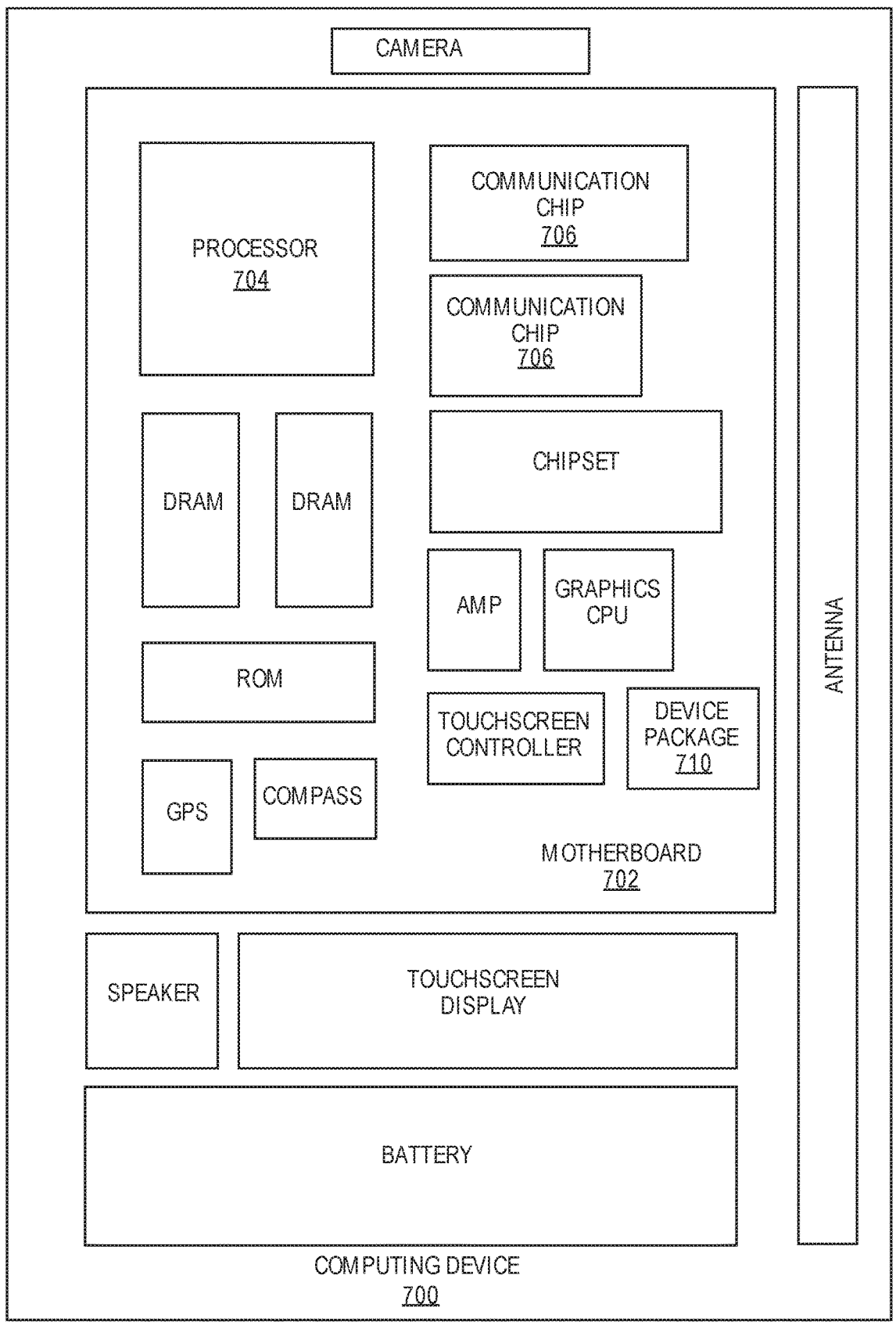
FIG. 7 is a schematic block diagram illustrating a computer system that utilizes a device package including a package substrate with a first dielectric having a first thickness that is less than a second thickness of a second dielectric, according to one embodiment.

FIG. 7 is a schematic block diagram illustrating a computer system 700 that utilizes a device package 710 (or a semiconductor package) having variable thicknesses within adjacent dielectric layers, according to one embodiment. FIG. 7 illustrates an example of computing device 700. Computing device 700 houses motherboard 702. For one embodiment, motherboard 702 may be similar to the package substrate 402 of FIG. 4. Motherboard 702 may include a number of components, including but not limited to processor 704, device package 710, and at least one communication chip 706. Processor 704 is physically and electrically coupled to motherboard 702. For some embodiments, at least one communication chip 706 is also physically and electrically coupled to motherboard 702. For other embodiments, at least one communication chip 706 is part of processor 704.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, MEMS based electrical systems, gyroscopes components, ADAS, 5G communication systems, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

Processor 704 of computing device 700 includes an integrated circuit die packaged within processor 704. Device package 710 may be, but is not limited to, a substrate, a packaging substrate, and/or a printed circuit board. Device package 710 may include one or more variable thicknesses within adjacent dielectric layers (as illustrated in FIGS. 1-3)—or any other components from the figures described herein—of the computing device 700. Further, as described herein, the device package 710 helps optimize multiple ICs that need their own dielectric thickness for optimal electrical performance by enabling these ICs to receive their own optimal dielectric thickness within adjacent dielectric layers (e.g., as shown with the package substrate 100 of FIG. 1 and the package substrates of FIGS. 2G and 3J)—without sacrificing the electrical needs of multiple ICs by selecting the dielectric (or ABF) thickness based on the most demanding electrical requirement of a single IC from that dielectric layer.

Note that device package 710 may be a single component/device, a subset of components, and/or an entire system, as the materials, features, and components may be limited to device package 710 and/or any other component of the computing device 700 that may need variable thicknesses within adjacent dielectric layers (e.g., the motherboard 402 and/or the processor 404 may need a similar build-up structures as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 706 also includes an integrated circuit die packaged within the communication chip 706. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

Although specific embodiments of exemplary apparatuses and methods were described above, one of skill in the art will recognize that in other embodiments many of the above steps may be re-arranged and/or omitted. The foregoing description of specific embodiments reveals the general nature of the disclosure sufficiently that others can, by applying current knowledge, readily modify and/or adapt it for various applications without departing from the generic concept. For example, additional redistribution traces, pads, and/or polymer layers could be used to form additional or multiple layers of one or more materials (e.g., metals) above the semiconductor package (or semiconductor wafer). Therefore, such adaptations and modifications are within the meaning and range of equivalents of the disclosed embodiments.

The following examples pertain to further embodiments. The various features of the different embodiments may be variously combined with some features included and others excluded to suit a variety of different applications.

The following examples pertain to further embodiments:

Example 1 is a package substrate, comprising of a first dielectric comprising a first conductive layer; a second dielectric comprising a second conductive layer and a third conductive layer. The second and third conductive layers are embedded in the second dielectric. A top surface of the third conductive layer is above a top surface of the second conductive layer; and a fourth conductive layer on the second dielectric. The first dielectric has a first dielectric thickness between the first conductive layer and the third conductive layer. The second dielectric has a second dielectric thickness between the second conductive layer and the fourth conductive layer. The second dielectric thickness is greater than the first dielectric thickness.

In example 2, the subject matter of example 1 can optionally include the first conductive layer on a dielectric. One or more vias disposed in the first dielectric and the second dielectric. The one or more vias couple at least two of the first conductive layer, the second conductive layer, the third conductive layer, and the fourth conductive layer.

In example 3, the subject matter of any of examples 1-2 can optionally include the second dielectric has a first bottom surface and a second bottom surface. A z-height of the first bottom surface is greater than a z-height of the second bottom surface.

In example 4, the subject matter of any of examples 1-3 can optionally include a portion of the third conductive layer on the first bottom surface of the second dielectric. The second conductive layer is on the second bottom surface.

In example 5, the subject matter of any of examples 1-4 can optionally include the second dielectric has a first dielectric thickness between the top surface of the portion of the third conductive layer and the fourth conductive layer. The first dielectric thickness of the second dielectric is less than the second dielectric thickness of the second dielectric. The first dielectric has a second dielectric thickness between the first conductive layer and the second conductive layer. The second dielectric thickness of the first dielectric is less than the first dielectric thickness of the first dielectric.

In example 6, the subject matter of any of examples 1-5 can optionally include one or more vias include a laser via and a zero misalignment via.

In example 7, the subject matter of any of examples 1-6 can optionally include two zero misalignment vias stacked on each other on the first conductive layer to define the first dielectric thickness of the first dielectric.

In example 8, the subject matter of any of examples 1-7 can optionally include the two zero misalignment vias couple the first conductive layer to the third conductive layer.

Example 9 is a method of forming a package substrate, comprising of disposing a first conductive layer on a dielectric. One or more vias are stacked on each other and disposed on the first conductive layer; disposing a first dielectric over the one or more stacked vias, the first conductive layer, and the dielectric. The first dielectric is patterned to form an opening through the first dielectric; patterning the opening of the first dielectric to form a via opening through the first dielectric that exposes a top surface on the first conductive layer; depositing a conductive material into the via opening to form a via on the first conductive layer; disposing a second conductive layer on the via and the opening of the first dielectric layer; disposing a third conductive layer on a top surface of the one or more stacked vias and a topmost surface of the first dielectric. A top surface of the third conductive layer is above a top surface of the second conductive layer. A via and a via pad are stacked on each other and disposed on the second conductive layer; and disposing a second dielectric layer over the second conductive layer, the third conductive layer, and the first dielectric layer. The second and third conductive layers are embedded in the second dielectric. A fourth conductive layer is disposed on the second dielectric layer. The first dielectric has a first dielectric thickness between the first conductive layer and the third conductive layer. The second dielectric has a second dielectric thickness between the second conductive layer and the fourth conductive layer. The second dielectric thickness is greater than the first dielectric thickness.

In example 10, the subject matter of example 9 can optionally include prior to disposing the fourth conductive layer, further comprising of a patterning the second dielectric to form one or more via openings through the second dielectric that expose top surfaces on the third conductive layer; and depositing a conductive material into the via openings in the second dielectric to form vias on the third conductive layer.

In example 11, the subject matter of any of examples 9-10 can optionally include patterning the first dielectric to form the opening through the first dielectric includes a plasma etching process that etches a portion of the first dielectric to form the opening.

In example 12, the subject matter of any of examples 9-11 can optionally include the second dielectric has a first bottom surface and a second bottom surface. A z-height of the first bottom surface is greater than a z-height of the second bottom surface.

In example 13, the subject matter of any of examples 9-12 can optionally include a portion of the third conductive layer is on the first bottom surface of the second dielectric. The second conductive layer is on the second bottom surface.

In example 14, the subject matter of any of examples 9-13 can optionally include the second dielectric has a first dielectric thickness between the top surface of the portion of the third conductive layer and the fourth conductive layer. The first dielectric thickness of the second dielectric is less than the second dielectric thickness of the second dielectric. The first dielectric has a second dielectric thickness between the first conductive layer and the second conductive layer. The second dielectric thickness of the first dielectric is less than the first dielectric thickness of the first dielectric.

In example 15, the subject matter of any of examples 9-14 can optionally include one or more vias that include a laser via and a zero misalignment via.

In example 16, the subject matter of any of examples 9-15 can optionally include two zero misalignment vias stacked on each other on the first conductive layer to define the first dielectric thickness of the first dielectric. The two zero misalignment vias couple the first conductive layer to the third conductive layer.

In example 17, the subject matter of any of examples 9-16 can optionally include the two zero misalignment vias couple the first conductive layer to the third conductive layer.

Example 18 is a package substrate, comprising of a first dielectric comprising a first conductive layer; a second dielectric comprising a second conductive layer; and a third conductive layer on the second dielectric. The first dielectric has a first dielectric thickness between the first conductive layer and the second conductive layer. The first and second dielectrics are combined to form a second dielectric thickness between the first conductive layer and the third conductive layer. The second dielectric thickness is greater than the first dielectric thickness.

In example 19, the subject matter of example 18 can optionally include the first conductive layer on a dielectric; a first via on the first conductive layer. The first via is disposed in the first dielectric. The first via is disposed between the first conductive layer and the second conductive layer; a second via on the first conductive layer. The second via is disposed in both the first and second dielectrics. The second via is disposed between the first conductive layer and the third conductive layer; and a third via on the second conductive layer. The third via is disposed in the second dielectric. The second via is disposed between the second conductive layer and the third conductive layer.

In example 20, the subject matter of any of examples 18-19 can optionally include the second via has a thickness that is greater than a thickness of the third via.

In example 21, the subject matter of any of examples 18-20 can optionally include the first, second, and third vias comprising a plated via, a laser via, or a zero misalignment via.

In example 22, the subject matter of any of examples 18-21 can optionally include the first via is a plated via. The second and third vias are laser vias.

In example 23, the subject matter of any of examples 18-22 can optionally include the first via defines the first dielectric thickness of the first dielectric.

In example 24, the subject matter of any of examples 18-23 can optionally include the second via defines the second dielectric thickness of the stacked first and second dielectrics.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
a first dielectric comprising a first conductive layer;
a second dielectric comprising a second conductive layer and a third conductive layer, wherein the second and third conductive layers are embedded in the second dielectric, and wherein a top surface of the third conductive layer is above a top surface of the second conductive layer; and
a fourth conductive layer on the second dielectric, wherein the first dielectric has a first dielectric thickness between the first conductive layer and the third conductive layer, wherein the second dielectric has a second dielectric thickness between the second conductive layer and the fourth conductive layer, and wherein the second dielectric thickness is greater than the first dielectric thickness.

2. The package substrate of claim 1, further comprising:
the first conductive layer on a dielectric; and
one or more vias disposed in the first dielectric and the second dielectric, wherein the one or more vias couple at least two of the first conductive layer, the second conductive layer, the third conductive layer, and the fourth conductive layer.

3. The package substrate of claim 1, wherein the second dielectric has a first bottom surface and a second bottom surface, wherein a z-height of the first bottom surface is greater than a z-height of the second bottom surface.

4. The package substrate of claim 3, wherein a portion of the third conductive layer is on the first bottom surface of the second dielectric, and wherein the second conductive layer is on the second bottom surface.

5. The package substrate of claim 4, wherein the second dielectric has a first dielectric thickness between the top surface of the portion of the third conductive layer and the fourth conductive layer, wherein the first dielectric thickness of the second dielectric is less than the second dielectric thickness of the second dielectric, wherein the first dielectric has a second dielectric thickness between the first conductive layer and the second conductive layer, and wherein the second dielectric thickness of the first dielectric is less than the first dielectric thickness of the first dielectric.

6. The package substrate of claim 4, wherein the one or more vias include a laser via and a zero misalignment via.

7. The package substrate of claim 6, wherein two zero misalignment vias are stacked on each other on the first conductive layer to define the first dielectric thickness of the first dielectric.

8. The package substrate of claim 7, wherein the two zero misalignment vias couple the first conductive layer to the third conductive layer.

9. A package substrate, comprising:
a first dielectric comprising a first conductive layer;
a second dielectric comprising a second conductive layer; and
a third conductive layer on the second dielectric, wherein the first dielectric has a first dielectric thickness between the first conductive layer and the second conductive layer, wherein the first and second dielectrics are combined to form a second dielectric thickness between the first conductive layer and the third conductive layer, and wherein the second dielectric thickness is greater than the first dielectric thickness.

10. The package substrate of claim 9, further comprising:
the first conductive layer on a dielectric;
a first via on the first conductive layer, wherein the first via is disposed in the first dielectric, and wherein the first via is disposed between the first conductive layer and the second conductive layer;
a second via on the first conductive layer, wherein the second via is disposed in both the first and second dielectrics, and wherein the second via is disposed between the first conductive layer and the third conductive layer; and a third via on the second conductive layer, wherein the third via is disposed in the second dielectric, and wherein the second via is disposed between the second conductive layer and the third conductive layer.

11. The package substrate of claim 10, wherein the first via defines the first dielectric thickness of the first dielectric.

12. The package substrate of claim 10, wherein the second via defines the second dielectric thickness of the stacked first and second dielectrics.

13. The package substrate of claim 9, wherein the second via has a thickness that is greater than a thickness of the third via.

14. The package substrate of claim 9, wherein the first, second, and third vias comprising a plated via, a laser via, or a zero misalignment via.

15. The package substrate of claim 14, wherein the first via is a plated via, and wherein the second and third vias are laser vias.

16. A method of forming a package substrate, comprising:
disposing a first conductive layer on a dielectric, wherein one or more vias are stacked on each other and disposed on the first conductive layer;
disposing a first dielectric over the one or more stacked vias, the first conductive layer, and the dielectric, wherein the first dielectric is patterned to form an opening through the first dielectric;
patterning the opening of the first dielectric to form a via opening through the first dielectric that exposes a top surface on the first conductive layer;
depositing a conductive material into the via opening to form a via on the first conductive layer;
disposing a second conductive layer on the via and the opening of the first dielectric layer;
disposing a third conductive layer on a top surface of the one or more stacked vias and a topmost surface of the first dielectric, wherein a top surface of the third conductive layer is above a top surface of the second conductive layer, and wherein a via and a via pad are stacked on each other and disposed on the second conductive layer; and
disposing a second dielectric layer over the second conductive layer, the third conductive layer, and the first dielectric layer, wherein the second and third conductive layers are embedded in the second dielectric, wherein a fourth conductive layer is disposed on the second dielectric layer, wherein the first dielectric has a first dielectric thickness between the first conductive layer and the third conductive layer, wherein the second dielectric has a second dielectric thickness between the second conductive layer and the fourth conductive layer, and wherein the second dielectric thickness is greater than the first dielectric thickness.

17. The method of claim 16, prior to disposing the fourth conductive layer, further comprising:
patterning the second dielectric to form one or more via openings through the second dielectric that expose top surfaces on the third conductive layer; and
depositing a conductive material into the via openings in the second dielectric to form vias on the third conductive layer.

18. The method of claim 16, wherein patterning the first dielectric to form the opening through the first dielectric includes a plasma etching process that etches a portion of the first dielectric to form the opening.

19. The method of claim 16, wherein the second dielectric has a first bottom surface and a second bottom surface, wherein a z-height of the first bottom surface is greater than a z-height of the second bottom surface.

20. The method of claim 19, wherein a portion of the third conductive layer is on the first bottom surface of the second dielectric, and wherein the second conductive layer is on the second bottom surface.

21. The method of claim 20, wherein the second dielectric has a first dielectric thickness between the top surface of the portion of the third conductive layer and the fourth conductive layer, wherein the first dielectric thickness of the second dielectric is less than the second dielectric thickness of the second dielectric, wherein the first dielectric has a second dielectric thickness between the first conductive layer and the second conductive layer, and wherein the second dielectric thickness of the first dielectric is less than the first dielectric thickness of the first dielectric.

22. The method of claim 16, wherein the one or more vias include a laser via and a zero misalignment via.

23. The method of claim 22, wherein two zero misalignment vias are stacked on each other on the first conductive layer to define the first dielectric thickness of the first dielectric.

24. The method of claim 23, wherein the two zero misalignment vias couple the first conductive layer to the third conductive layer.

* * * * *